United States Patent
Kamijima et al.

(10) Patent No.: US 7,561,604 B2
(45) Date of Patent: Jul. 14, 2009

(54) LASER LIGHT SOURCE DEVICE, ILLUMINATION DEVICE, IMAGE DISPLAY DEVICE, AND MONITOR DEVICE

(75) Inventors: Shunji Kamijima, Hara-mura (JP); Keiko Kumagai, Minamiminowa-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/007,448

(22) Filed: Jan. 10, 2008

(65) Prior Publication Data

US 2009/0010001 A1 Jan. 8, 2009

(30) Foreign Application Priority Data

Jan. 12, 2007 (JP) ............................. 2007-004573
Dec. 20, 2007 (JP) ............................. 2007-328968

(51) Int. Cl.
*H01S 3/10* (2006.01)

(52) U.S. Cl. ............................. 372/23; 372/21; 372/22

(58) Field of Classification Search .................. 372/23, 372/21

See application file for complete search history.

(56) References Cited

U.S. PATENT DOCUMENTS

| | | | |
|---|---|---|---|
| 6,975,294 B2 | 12/2005 | Manni et al. | |
| 2006/0023173 A1 | 2/2006 | Mooradian et al. | |
| 2006/0023757 A1 | 2/2006 | Mooradian et al. | |
| 2006/0268241 A1 | 11/2006 | Watson et al. | |
| 2006/0280219 A1 | 12/2006 | Shchegrov | |
| 2007/0153862 A1* | 7/2007 | Shchegrov et al. | 372/50.124 |
| 2007/0153866 A1* | 7/2007 | Shchegrov et al. | 372/50.124 |

FOREIGN PATENT DOCUMENTS

| | | |
|---|---|---|
| JP | A-59-128525 | 7/1984 |
| JP | A-04-158588 | 6/1992 |
| JP | A-2002-250694 | 9/2002 |
| JP | A-2004-503923 | 2/2004 |
| JP | A-2004-125943 | 4/2004 |

OTHER PUBLICATIONS

Moorandian et al., "High Power Extended Vertical Cavity Surface Emitting Diode Lasers and Arrays and their Applications," *Micro-Optics Conference*, pp. 1-4, Tokyo, Nov. 2, 2005.

* cited by examiner

*Primary Examiner*—Dung T Nguyen
(74) *Attorney, Agent, or Firm*—Oliff & Berridge, PLC

(57) ABSTRACT

A laser light source device includes: a light source; an external resonator, a wavelength conversion element converting the wavelength of part of incident light having the first wavelength into the second wavelength which is different from the first wavelength; and an optical-path conversion element causing the light that has been converted into light of the second wavelength in the process of traveling to the light source due to reflection from the external resonator to be separated into a second optical-path different from the first optical-path, and emitting a second laser light of the second wavelength. In the laser light source device, and the height of the wavelength conversion element is greater than a distance between an optical-axis of the first laser light on an end face of the wavelength conversion element which is close to the external resonator and an optical-axis of the second laser light.

20 Claims, 11 Drawing Sheets

LASER LIGHT SOURCE DEVICE, ILLUMINATION DEVICE, IMAGE DISPLAY DEVICE, AND MONITOR DEVICE

CROSS-REFERENCE TO RELATED APPLICATION

This application is based on and claims priority from Japanese Patent Application No. 2007-004573, filed on Jan. 12, 2007, and Japanese Patent Application No. 2007-328968, filed on Dec. 20, 2007, the contents of which are incorporated herein by reference.

BACKGROUND

1. Technical Field

The present invention relates to a laser light source device, an illumination device, an image display device, and a monitor device.

2. Related Art

In recent years, in the field of opto-electronics including fiber-optic communication, light application measurement, light display, and the like, laser light source devices have been widely used.

As examples of laser light source devices, laser light source devices in which the wavelength of the fundamental wave laser is used directly without conversion, and laser light source devices in which a converted wavelength of the fundamental wave laser is used, are both well-known.

In the laser light source device in which the converted wavelength of the fundamental wave laser is used, a wavelength conversion element that converts the wavelength of the fundamental wave laser is well-known.

The wavelength conversion element is also called the Second Harmonic Generation element (SHG element).

Conventionally, since the wavelength conversion efficiency of the SHG element is approximately 30 to 40%, the power of the light that has been converted by the SHG element is appreciably low when compared with the power of the output light of the fundamental laser light source.

As a constitution suppressing power reduction of the output light, the laser light source device disclosed in Japanese Unexamined Patent Application, First Publication No. S59-128525 has been suggested.

In the laser light source device, the light that has been emitted from an internal-resonator type laser light source and has passed through an SHG element is separated into an SHG light whose wavelength has been converted and into the residual fundamental-wave light In addition, by leading the residual fundamental-wave light to re-pass through the SHG element, the second SHG light whose wavelength has been converted is extracted.

The second SHG light is synthesized to a first SHG light in the state mat the second SHG light whose polarization has been converted into the polarization different from the polarization direction of the first SHG light by 90°.

In the laser light source device of Japanese Unexamined Patent Application, First Publication No. S59-128525, in the above-described manner, power reduction of the output light is suppressed due to utilization of the light synthesized by both the first SHG light and the second SHG light as output light.

In the above-described laser light source device disclosed as Japanese Unexamined Patent Application, First Publication No. S59-128525, though the second SHG light whose wavelength has been converted by leading the residual fundamental-wave light to re-pass through the SHG element can be utilized, the residual fundamental-wave light whose wavelength has not been converted even by re-passing through the SHG element can not be utilized. Therefore, light utilization efficiency is never dramatically improved.

In addition, when making the above residual fundamental-wave light directly return to the fundamental laser light source, there is concern that the power of the fundamental laser light source may be reduced or unstable. Therefore, the constitution making the residual fundamental-wave light not return to the light source is necessary. There is thereby concern that an optical system will increase in size. In addition, there is concern that as the length of the optical-path is extended, and light loss occurs due to an increase in the number of times the light passes through the optical elements.

Furthermore, in the above-described laser light source device disclosed as Japanese Unexamined Patent Application, First Publication No. S59-128525, in order to synthesize the first SHG light and the second SHG light, their polarization directions are made to differ from each other by 90°, the output light thereby becomes light synthesized by the two-type polarization.

Therefore, when the laser light source device disclosed as Japanese Unexamined Patent Application, First Publication No. S59-128525 is used in combination with a polarization-controller-type device (e.g., liquid crystal device) in which only one polarization is utilized, only one SHG light is allowed to be used in the absence of the constitution in which the polarization directions of the first SHG light and the second SHG light are completed.

That is, in the laser light source device disclosed as Japanese Unexamined Patent Application, First Publication No. S59-128525, though stabilized output can be obtained while suppressing power reduction of the output light to some extent, light utilization efficiency in not further improved.

Specifically, when used in combination with the polarization-controller-type device, there is also concern that the light utilization efficiency is insufficient.

Furthermore, when using the above-described laser light source device in combination with a liquid crystal device, a diffusion optical member which diffuses the light of the laser light source device is necessary.

In addition, since the light which is emitted toward a liquid crystal device through a large-size diffusion optical member degrades the image quality, reducing the size of the diffusion optical member is thereby desired.

SUMMARY

An advantage of some aspects of the invention is to provide a laser light source device, an illumination device, an image display device, and a monitor device where power reduction of the output light is efficiently suppressed, the light utilization efficiency is improved, stabilized output is obtained due to the polarization direction of the output light being completed, and it is possible to reduce the size of a diffusion optical member.

A first aspect of the invention provides a laser light source device including: a light source emitting light of a first wavelength; an external resonator selectively reflecting the light of the first wavelength and thereby leading the light toward the light source, and emitting a first laser light of a second wavelength which is different from the first wavelength; a wavelength conversion element provided in a first optical-path formed between the light source and the external resonator, and converting the wavelength of part of incident light having the first wavelength into the second wavelength which is different from the first wavelength; and an optical-path conversion element causing the light that has been converted into light of the second wavelength in the process of traveling to the light source due to reflection from the external resonator to be separated into a second optical-path different from the first optical-path, and emitting a second laser light of the second wavelength. In the laser light source device, the first laser light and the second laser light are utilized as output lights, and the height of the wavelength conversion element is greater than a distance between an optical-axis of the first laser light on an end face of the wavelength conversion element which is close to the external resonator and an optical-axis of the second laser light.

In other words, when the height of the wavelength conversion element (length of the wavelength conversion element in a direction orthogonal to the optical axis of light passing through the wavelength conversion element) is W1, and when the distance between the optical-axis of the first laser light on the end face of the wavelength conversion element which is close to the external resonator is W2 and the optical-axis of the second laser light, the relationship W2<W1 is consistent.

According to the laser light source device of the first aspect of the invention, the wavelength conversion element is provided in the resonator structure (first optical-path) constituted by the light source and the external resonator. In addition, the second laser light whose wavelength has been converted in the process of traveling to the light source due to reflection from the external resonator is extracted into the second optical-path by the optical-path conversion element and is utilized. It is thereby possible to efficiently reduce the power reduction of the output light.

Furthermore, since the wavelength conversion element is provided inside the resonator structure constituted by the light source and the external resonator, a structure is not necessary to lead the light so that the light does not return to the light source, the light having not been converted into a light of the second wavelength while traveling to the light source due to the reflection from the external resonator.

It is possible to decrease the light loss caused by malfunctions, such as, by extending the length of the optical-path by increasing the size of the optical system or by increasing the number of times the light passes through the optical elements.

Furthermore, since it is sufficient that only the direction of the second laser light is substantially led to travel in the same direction of travel of the first laser light, it is possible to obtain the output light having a substantially completed polarization direction. Therefore, even if, for example, the laser light source device is used in combination with the polarization-controller-type device, it is possible to improve light utilization efficiency.

Furthermore, since the relationship W2<W1 is satisfied, the distance between the second laser light and the first laser light is narrowed. Therefore, for example, when a diffusion optical member is located in advance of the two laser lights, it is possible to reduce the size of the diffusion optical member.

The light that is emitted through the diffusion optical member whose size is reduced can obtain clean illumination with a high level of image quality and a high level of light utilization efficiency.

Furthermore, according to the laser light source device of the first aspect of the invention, even if the bottom portion of the light source, the external resonator, the wavelength conversion element, and the optical-path conversion element are held by a fixing member, such as, an adhesive, a mechanical clamp, or the like, since the above-described relationship (W2<W1) is satisfied, interception of the first and second laser lights by the fixing member does not occur. Therefore, reduction of yield can be prevented.

Furthermore, since the laser beam can be incident into the substantially same portion of a diffusion member and can be reliably obtained the illumination onto the substantially same region, it is possible to realize a high level of illumination efficiency while reducing light loss.

Therefore, it is possible to reduce the size of the diffusion optical member, which is used in combination with the laser light source device. In addition, the laser light source device having a high level of light utilization efficiency and emitting the output light having a substantially completed polarization direction is realized, and in which the output is stabilized, while efficiently suppressing power reduction of the output light.

It is preferable that, in the laser light source device of the first aspect of the invention, the height of the external resonator be greater than the distance between the optical-axis of the first laser light and the optical-axis of the second laser light.

In other words, when the height of the external resonator (length of the external resonator in a direction orthogonal to the first laser light passing through the external resonator) is W3, it is preferable that the relationship W2<W3 be consistent.

In this constitution, since the relationship W2<W3 is satisfied in addition to the above-described relationship (W2<W1), it is possible to avoid a reduction in the transmissivity of the optical member that is disposed in the optical-path, caused by the effect of, for example, an adhesive or a holding member which holds the bottom side portion of the external resonator. It is thereby possible to further improve light utilization efficiency.

In addition, the external resonator needs to align the reflection face of the external resonator with the light source, based on the length in the direction of a beam and the reflection angle. However, according to the invention, it is easy to fix the external resonator and the light source at a desired angle while easily aligning the external resonator and the light source, and it is possible to prevent interception of the second laser light.

It is preferable that, in the laser light source device of the first aspect of the invention, the first laser light be substantially parallel to the second laser light.

There is a high possibility that the laser light source device will be used in combination with other optical devices such as lenses, filters, mirrors, diffraction gratings, prisms, light modulation elements, and the like. The characteristics of these optical devices may vary depending on the angle of the incidence light.

Furthermore, illumination loss occurs for obtaining margin in irregularities of illumination region, caused by irregularities of the angles of the incidence light.

By adopting the invention, since the first laser light is substantially parallel to the second laser light, it is easy to design an optical device or to determine the position of an optical device, which is disposed behind the laser light source device.

Therefore, more specifically, when the laser light source device is applied to an image display device, a monitor device, or the like, it is possible to obtain effects where the degree of freedom in optical design increases dramatically.

Furthermore, since the illumination region which is obtained in advance of the diffusion optical member is formed on the region depending on the incidence angle of the laser beam, it is possible to illuminate the substantially same region, and it is possible to illuminate a desired area with a high level of illumination efficiency.

It is preferable that, in the laser light source device of the first aspect of the invention, the length of the optical-path conversion element in the direction of the beam of the second laser light emitted from the optical-path conversion element be shorter than the height of the optical-path conversion element.

In other words, when the length of the optical-path conversion element (the length of the optical-path conversion element in the direction of the beam of the second laser light which is emitted from the optical-path conversion element) is W4, and when the height of the optical-path conversion element (the length of the optical-path conversion element in a direction orthogonal to the optical axis of light passing through the wavelength conversion element) is W5, it is preferable that the relationship W4<W5 be consistent.

By this constitution, the size of the optical-path conversion element in the direction of the beam of the second laser light is suppressed, the size of the wavelength conversion element is enlarged as much as possible, and the length of the wavelength conversion optical-path in the wavelength conversion element can be reliably elongated.

Therefore, the conversion efficiency that a wavelength is converted into the second wavelength in the wavelength conversion element is improved, and it is possible to further improve the light utilization efficiency.

A second aspect of the invention provides a laser light source device including: a light source emitting light of a first wavelength; an external resonator selectively reflecting the light of the first wavelength and thereby leading the light toward the light source, and emitting a first laser light of a second wavelength which is different from the first wavelength; a wavelength conversion element provided in a first optical-path formed between the light source and the external resonator, converting the wavelength of part of incident light having the first wavelength into the second wavelength which is different from the first wavelength, and thereby obtaining harmonics; an optical-path conversion element causing the light that has been converted into light of the second wavelength in the process of traveling to the light source due to reflection from the external resonator to be separated into a second optical-path different from the first optical-path, and emitting a second laser light of the second wavelength; and an optical-path adjustment section adjusting the first laser light to be output from a predetermined position in the wavelength conversion element. In the laser light source device, the first laser light and the second laser light are utilized as output lights.

In the laser light source device of the second aspect of the invention, the wavelength conversion element is provided in the resonator structure (first optical-path) constituted by the light source and the external resonator. In addition, the second laser light whose wavelength has been converted in the process of traveling to the light source due to reflection from the external resonator is extracted into the second optical-path by the optical-path conversion element and is utilized. It is thereby possible to efficiently reduce the power reduction of the output light.

Furthermore, since the wavelength conversion element is provided inside the resonator structure constituted by the light source and the external resonator, a structure is not necessary to lead a light so that the light does not return to the light source, the light having not been converted into a light of the second wavelength while traveling to the light source due to the reflection from the external resonator.

It is possible to decrease the light loss caused by malfunctions, such as, by extending the length of the optical-path by increasing the size of the optical system or by increasing the number of times the light passes through the optical elements.

Furthermore, since it is sufficient that only the direction of the second laser light is substantially led to the same direction of travel of the first laser light it is possible to obtain the output light having a substantially completed polarization direction. Therefore, even if, for example, the laser light source device is used in combination with the polarization-controller-type device, it is possible to improve light utilization efficiency.

Furthermore, the distance between the second laser light and the first laser light can be narrowed by the optical-path adjustment section. When, for example, a diffusion optical member is located in advance of the two laser lights, it is possible to reduce the size of the diffusion optical member.

The light that is emitted through the diffusion optical member whose size is reduced can obtain clean illumination with a high level of image quality and a high level of light utilization efficiency.

Furthermore, by the optical-path adjustment section, it is possible to lead the light of first wavelength making the first laser light pass through a predetermined position (for example, a portion in which the pitch of polarization inversion is stabilized in the wavelength conversion element) in the wavelength conversion element. It is thereby possible to improve the reliability.

Therefore, it is possible to reduce the size of the diffusion optical member, which is used in combination with the laser light source device. The laser light source device having a high level of light utilization efficiency is realized, in which polarization directions of the output light is completed, and the output is stabilized, while efficiently suppressing power reduction of the output light.

It is preferable that, in the laser light source device of the second aspect of the invention, the optical-path conversion element include: a fundamental-wave conversion section converting the optical-path of the light of the first wavelength from the light source; a separation section selectively reflecting the light that has been converted into the second wavelength in the process of traveling to the light source due to reflection from the external resonator and thereby separating the light into the second optical-path; and a harmonics optical-path conversion section converting the optical-path of light of the second wavelength that has been separated by the separation section and thereby making the light become the second laser light.

By using the optical-path conversion element it is possible to reliably obtain the above-described first laser light and second laser light.

It is preferable that, in the laser light source device of the second aspect of the invention, the optical-path conversion element include the optical-path adjustment section.

In this constitution, since the optical-path adjustment section is constituted by a part of the optical-path conversion element, it is possible to simplify the constitution of the laser light source device.

It is preferable that in the laser light source device of the second aspect of the invention, the optical-path adjustment section be constituted by a support member supporting the optical-path conversion element.

In this constitution, the optical-path conversion element can be held onto a predetermined position, and as described above, it is thereby possible to reliably extract the second laser light toward an exterior.

It is preferable that in the laser light source device of the first and the second aspect of the invention, the wavelength conversion element include a holding face onto which a face of the wavelength conversion element is held, and a center section parallel to the optical-path of the first laser light in the wavelength conversion element. In the laser light source device, the optical-path of the first laser light is positioned inside the wavelength conversion element and between the center section and the optical-path of the second laser light.

In this constitution, it is possible to lead the first laser light to be close to the second laser light while leading the first laser light to pass through the inner wavelength conversion, element and the second laser light to pass outside the wavelength conversion element.

It is preferable that, in the laser light source device of the first and the second aspect of the invention, the light source include a plurality of arrayed emission sections.

In the invention, when the arrayed light source is used, the area of the emission end face (the incident end face) of the optical-path conversion element, the wavelength selective element, and the external resonator, can be suitably expanded depending on the area of the array.

Therefore, in the above-described constitution, even if the light source is an array, the device does not need to be extremely increased in size, and it is possible to utilize the simple constitution described above.

Therefore, even if the light source is an array, it is possible to efficiently improve the output power of the output light by increasing the amount of light by arraying, while obtaining the effects in which power reduction of the output light can be efficiently suppressed, light utilization efficiency can be improved, the output light has a substantially completed polarization direction, and the output can be stabilized.

It is preferable that, in the laser light source device of the first and the second aspect of the invention, the wavelength conversion element be a wavelength conversion element of Quasi Phase Matching.

In this constitution, since the wavelength conversion element of the Quasi Phase Matching whose conversion efficiency is higher than that of other types of wavelength conversion elements is included, the degree of effectiveness of the invention is further improved.

A third aspect of the invention provides an illumination device including: the laser light source device described above; and a diffusion optical member arranged in the direction of travel of the laser light emitted from the laser light source device.

According to the illumination device of the third aspect of the invention, since the above-described laser light source device is included, reduction of the size of the diffusion optical member is achieved, and the illumination device having high performance can be realized into the reduced size with a high level of image quality of light.

It is preferable that, in the illumination device of the third aspect of the invention, the diffusion optical member be formed by a computer generated hologram.

In this constitution, the size of the computer generated hologram is reduced, and it is possible to further improve the light utilization efficiency.

A fourth aspect of the invention provides an image display device including: a light source section constituted by the illumination device described above; and a light modulation element modulating the light emitted from the light source in accordance with image information.

According to the image display device of the fourth aspect of the invention, since the illumination device having the above-described laser light source device is included as the light source, a high level of light utilization efficiency is obtained.

A fifth aspect of the invention provides a monitor device including: the laser light source device described above; a capturing section capturing an object which is irradiated by the laser light source device.

According to the monitor device of the fifth aspect of the invention, since the above-described laser light source device is included, a high level of light utilization efficiency is obtained.

BRIEF DESCRIPTION OF THE DRAWINGS

FIG. 12A is a side view of the laser light source device, and FIG. 12B is a cross-sectional view illustrating the optical-path in the laser light source device.

DESCRIPTION OF EXEMPLARY EMBODIMENTS

Figure 1:
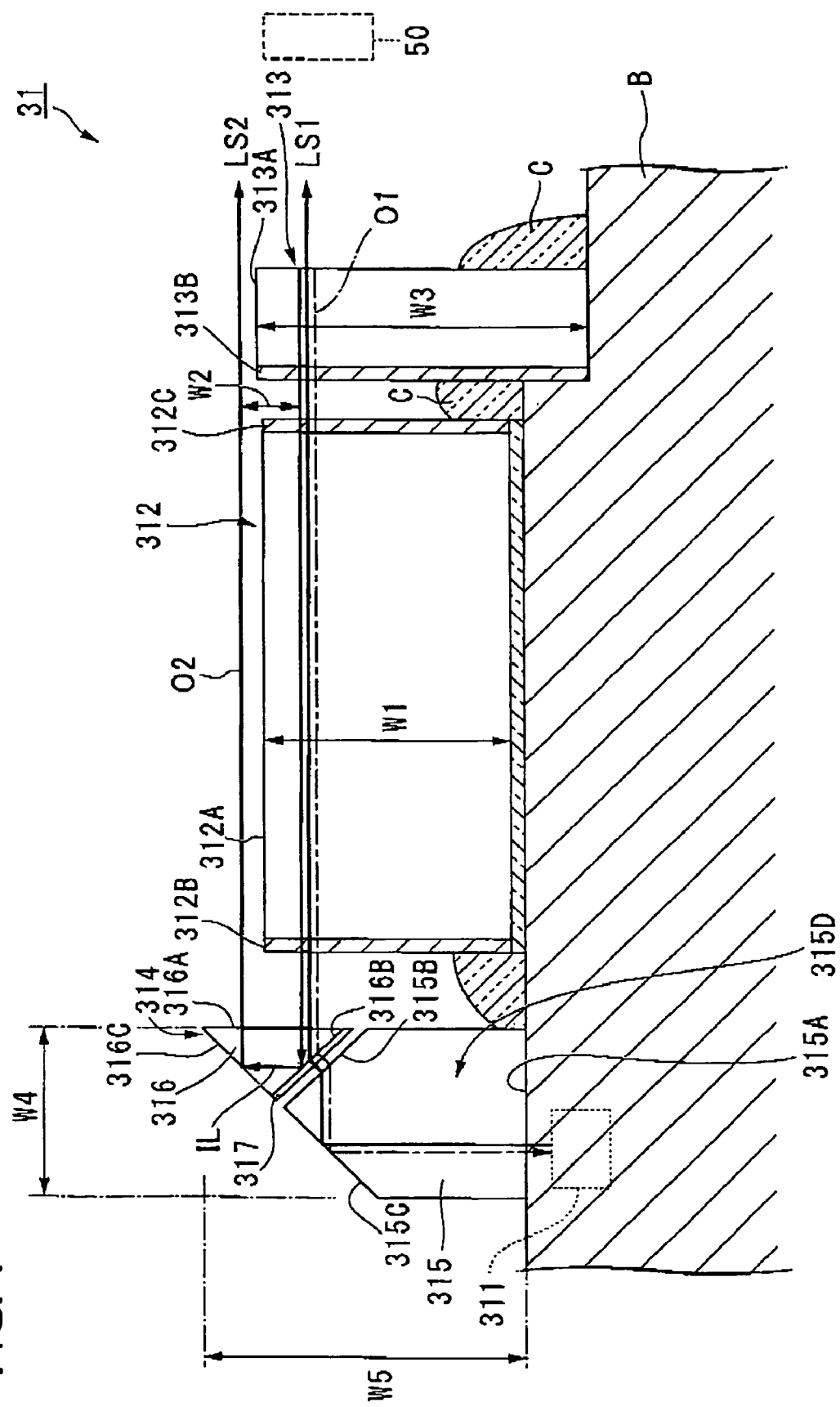
FIG. 1 is a schematic view showing a constitution of a laser light source device of a first embodiment.

Hereinafter, the invention will be described with reference to the accompanying drawings.

The scale of each member in the drawings below has been changed appropriately to sizes that enable each member to be recognized easily.

First Embodiment

FIG. 1 is a schematic view showing a constitution of a laser light source device of the first embodiment.

A laser light source device 31 includes a light source 311, a wavelength conversion element 312 (Harmonic Generation element), an external resonator 313, and an optical-path conversion element 314.

The light source 311 emits light of a first wavelength.

In the laser light source device 31 of the first embodiment the light source 311, the wavelength conversion element 312, the external resonator 313, and the optical-path conversion element 314 is held onto a base section B constituted by, for example, a metal frame or the like.

The constituting members of the laser light source device 31 (the light source 311, the wavelength conversion element 312, the external resonator 313, the optical-path conversion element 314) are fixed on the base section B (fixing member) by adhesive C.

As the method for constituting each of the members, the combination the base section B with the adhesive is not limited, for example, a mechanical clamp or the like may be adopted.

Figure 2:
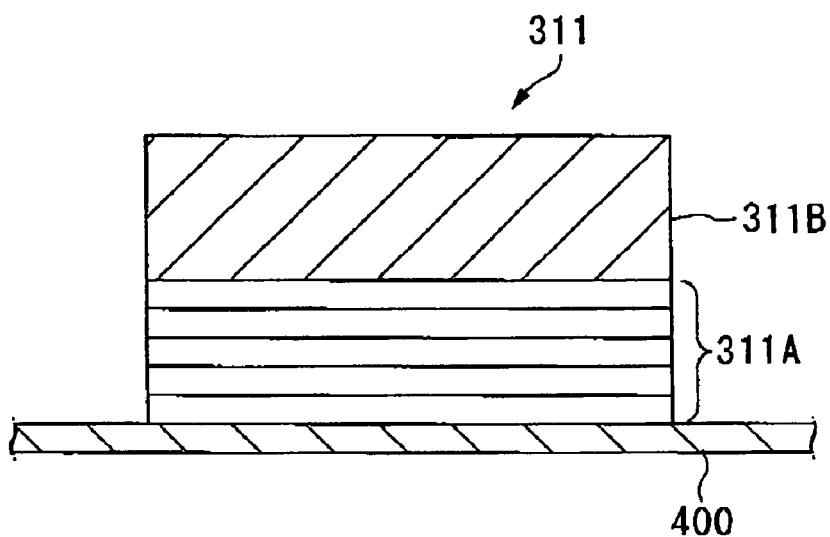
FIG. 2 is a schematic cross-sectional view of a constitution of a light source.

FIG. 2 is a schematic cross-sectional view showing the structure of the light source 311.

As shown in FIG. 2, the light source 311 emitting laser light is referred to as a surface emission-type semiconductor laser. The light source 311 includes, for example, a substrate 400 constituted by a semiconductor wafer, a mirror layer 311A formed on the substrate 400 and functioning as a reflection mirror, and a laser medium 311B laminated on the top surface of the mirror layer 311A.

The mirror layer 311A is constituted by a lamination body including a dielectric having a high refractive index and a dielectric having a low refractive index. These dielectrics are formed on the substrate 400 by, for example, a CVD (Chemical Vapor Deposition) method.

The thickness of each layer instituting the mirror layer 311A, the material of each layer, and number of the layers are optimized depending on the wavelength (first wavelength) of the light emitted from the light source 311. The structure of the mirror layer 311A is optimized so that a high level of light intensity is obtained through interference with and amplification by the reflected light.

The laser medium 311B is formed on the surface of the mirror layer 311A. An electriferous section (not shown) is connected with the laser medium 311B. The laser medium 311B emits a laser light having a wavelength predetermined by the amount of current applied by the electriferous section.

The laser medium 311B causes the light including the specific wavelength (first wavelength) to be amplified by resonation the light of the first wavelength between the mirror layer 311A and the external resonator 313 as shown in FIG. 1.

Therefore, the light reflected by the mirror layer 311A and the external resonator 313 described below is amplified by resonation with the light newly emitted from the laser medium 311B. By this constitution, the light which has been resonated is emitted from the light emission end face of the laser medium 311B in a direction substantially orthogonal to the substrate 400 or the mirror layer 311A.

The wavelength conversion element 312 converts the wavelength of the light which is incident into itself into the substantial half wavelength (second wavelength) of the light.

As shown in FIG. 1, the wavelength conversion element 312 is provided in a first optical-path O1 formed between the light source 311 and the external resonator 313.

Furthermore, the wavelength conversion element 312 includes a center section (center line) which is parallel to the first optical-path O1 of the inner wavelength conversion element 312.

In addition, the wavelength conversion element 312 includes a holding face 312D. On the holding face 312D, the wavelength conversion element 312 is held onto the base section B.

Figure 3:
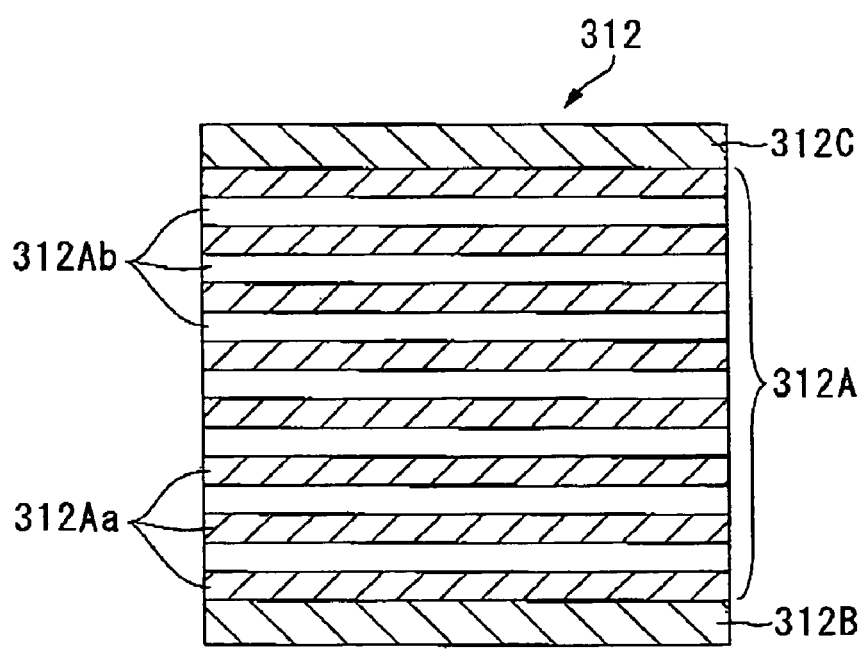
FIG. 3 is a schematic cross-sectional view showing a constitution of a wavelength conversion element.

FIG. 3 is a schematic cross-sectional view showing the structure of a wavelength conversion element 312.

The wavelength conversion element 312 is formed, for example, in a quadrangular pillar-shaped form, and includes a wavelength conversion section 312A and anti-reflective films (AR films) 312B and 312C.

The anti-reflective film 312B is formed on the surface (incidence end face) of wavelength conversion section 312A which is close to the light source 311.

The anti-reflective film 312C is formed on the surface (emission end face) of the wavelength conversion section 312A which is closer to the external resonator 313.

The wavelength conversion section 312A is a Second Harmonic Generation element (SHG element) generating second harmonics of the light which is incident into itself.

The wavelength conversion section 312A includes a periodic polarization inversion structure. In the wavelength conversion section 312A, the wavelength of the light which is incident into itself is converted into the substantial half wavelength (second wavelength) of the light due to the wavelength conversion by Quasi Phase Matching (QPM).

In this manner, since the Quasi Phase Matching whose conversion efficiency is higher than that of other types of wavelength conversion elements is used, the degree of effectiveness of the invention as described below is further improved.

For example, when the wavelength (first wavelength) of the light emitted from the light source 311 is 1064 nm (near infrared), the wavelength conversion section 312A converts the first wavelength into a wavelength half as large, which is 532 nm (the second wavelength). The wavelength conversion section 312A thereby generates a green-colored light.

However, as described above, the conventional wavelength conversion efficiency of the wavelength conversion section 312A is approximately 30 to 40%. Thus, all light emitted from the light source 311 is not converted into the second wavelength light.

The periodic polarization inversion structure is formed in a crystal substrate made of an inorganic nonlinear optical material (e.g., lithium niobate (LiN:LiNbO$_3$), lithium tantalate (LT:LiTaO$_3$), or the like).

Specifically, in the periodic polarization inversion structure, a plurality of two types regions 312Aa and 312Ab whose polarization directions are inverted to each other are formed. The regions 312Aa and 312Ab are alternately formed by a predetermined distance in a direction substantially orthogonal to the emission direction of the light emitted from the light source 311.

The pitch between the two regions 312Aa and 312Ab are determined by the wavelength of the incidence light and the refractive-index dispersion of the crystal substrate, as needed.

Conventionally, in the laser light oscillated from a semiconductor laser, a plurality of longitudinal modes oscillates in gain-bandwidth, and the wavelength thereof is varied by temperature change or the like.

Therefore, the allowable range of the wavelength of the light which is converted in the wavelength conversion element 312, is approximately 0.3 nm. The allowable range varies at approximately 0.1 nm/° C. depending on the temperature of service condition.

The AR films 312B and 312C are, for example, dielectric films constituted by a single layer or a multilayer, and lead both the first wavelength light and the second wavelength light to pass therethrough, for example, at a transmissivity greater than or equal to 98%.

These AR films 312B and 312C may be omitted because the AR films 312B and 312C are not essential films for achieving functions of the wavelength conversion element 312.

Thus, the wavelength conversion element 312 can be constituted by the wavelength conversion section 312A alone.

The external resonator 313 has functions so that the light of the first wavelength is led to selectively reflect toward the light source 311, and so that the light other that of the first wavelength and the light including the second wavelength is led to pass through.

The external resonator 313 also has the function to narrow the bandwidth of the wavelength of the light which is amplified by selectively reflecting the light of the first wavelength.

As shown in FIG. 1, the external resonator 313 is formed on the first optical-path O1 so as to be disposed substantially orthogonal to the first optical-path O1.

Furthermore, the incidence end face of the external resonator 313 faces toward the emission end face of the wavelength conversion element 312.

Figure 4:
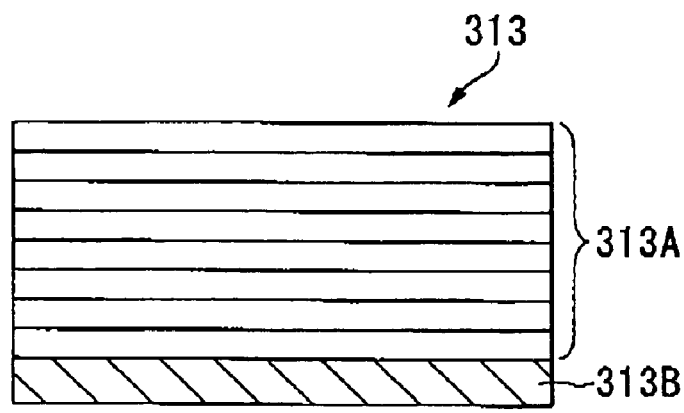
FIG. 4 is a schematic cross-sectional view showing a constitution of an external resonator.

FIG. 4 is a schematic cross-sectional view showing the structure of the external resonator.

The external resonator 313 is formed in a quadrangular pillar-shaped form similar to the wavelength conversion element 312.

The external resonator 313 also includes a Bragg grating section 313A that is the volume phase grating in which a Bragg grating structure is formed, and an anti-reflective film 313B (AR film) that is formed on the surface (incidence end face) of the Bragg grating section 313A, which is closer to the wavelength conversion element 312.

The Bragg grating section 313A is constituted by a plurality of layers formed along the optical-path O1.

The Bragg grating section 313A is formed in a glass layer so as to laminate the interference patterns having different refractive indexes each other, by irradiating with ultraviolet light having a predetermined wavelength onto the glass layer constituting a material mainly including $SiO_2$, such as alkali boro-aluminosilicate glass or the like.

Due to the Bragg grating section 313A, the functions of the external resonator 313 described above can be obtained.

The AR film 313B is a dielectric film constituted by a single layer or a multilayer and leads both the first wavelength light and the second wavelength light to pass therethrough, for example, at a transmissivity greater than or equal to 98%.

The AR film 313B can be formed not only at the incidence end face of the Bragg grating section 313A but also at the emission end face.

The AR film 313B may be omitted because the AR film 313B is not an essential film for achieving the functions of the external resonator 313.

Thus, the external resonator 313 can be constituted by the Bragg grating section 313A alone.

Figure 5:
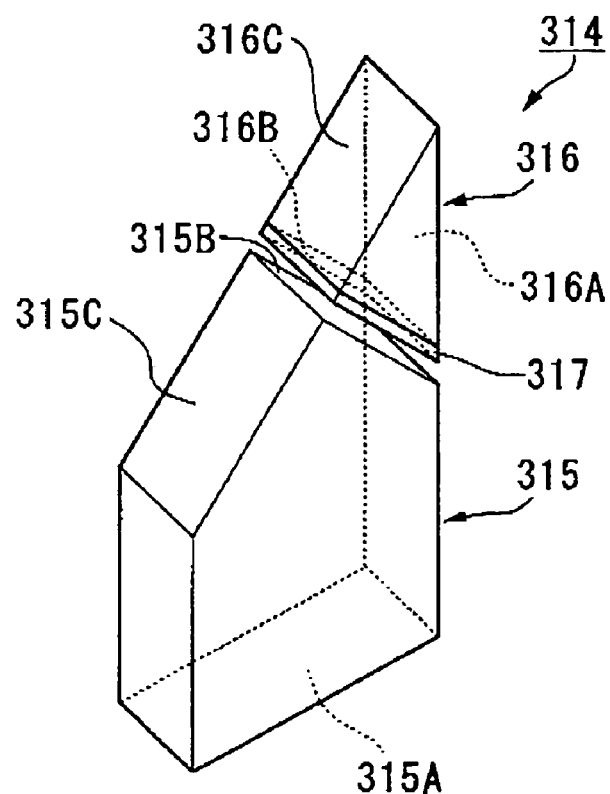
FIG. 5 is a perspective view of an optical-path conversion element.

FIG. 5 is a perspective view showing an optical-path conversion element 314.

As shown in FIGS. 1 and 5, the optical-path conversion element 314 includes first and second prisms 315 and 316 which are translucent members, and a selective reflection film 317 formed between the first and second prisms 315 and 316.

The prism 315 is made of an optical glass such as BK7 or the like, in an isosceles triangular pillar-shaped form. As shown in FIG. 1, a surface 315A of the prism 315 is disposed so as to face the light source 311. In addition, the surface 315A is disposed so as to be substantially orthogonal to the first optical-path O1.

Furthermore, a surface 315B is parallel to a surface 316B of the second prism 316 described below. In addition, a surface 315C is a flat surface which is disposed at the angle so that the total reflection condition relative to the first optical-path O1 is obtained.

That is, the surfaces 315C and 315B of the first prism function as a fundamental-wave conversion section which changes the optical-path in the light of the first wavelength from the light source 311 and leads the light toward the second prism 316.

The second prism 316 is made of an optical glass such as BK7 or the like similar to the first prism 315, in a triangular pillar-shaped form.

Three side surfaces of the prism 316 are constituted by surfaces 316B and 316C which include two sides sandwiching the vertex angle of the triangular, and a surface 316A which includes the oblique side.

The selective reflection film 317 is formed on the surface 316B.

The selective reflection film 317 is formed of, for example, a dielectric multilayer.

The dielectric multi layer can be formed by, for example, a CVD (Chemical Vapor Deposition) method.

The thickness of each layer constituting the multi layer, the material of each layer, and the number of layers are optimized depending on the requirements of the characteristics.

The selective reflection film 317 is provided between the light source 311 and the wavelength conversion element 312 and has the characteristics in that the light having the second wavelength is led to selectively reflect and in that the light having the first wavelength is led to pass therethrough.

That is, the selective reflection film 317 includes the functions of a dichroic mirror. Therefore, the surface 316B functions as a separation section, which selectively reflects the light of the second wavelength, and which thereby separates the light into the second optical-path O2 mat is different from the above-described first optical-path O1.

In the selective reflection film 317, it is preferable that the transmissivity relative to the light of the first wavelength and the reflectance relative to the light including the second wavelength be high, but it is sufficient that the degree of the transmissivity and the reflectance are greater than 80%.

The surface 315B of the first prism 315 is connected to the surface 316B of the prism 316 on which the selective reflection film 317 is formed, via an optical adhesive, for example, an adhesive curable by ultraviolet light or the like.

The surface 316A is disposed so as to face toward a part of the wavelength conversion element 312.

In addition, the surface 316A is disposed so as to be substantially orthogonal to the first optical-path O1.

The surface 316C is a flat surface which is disposed at the angle so that the total reflection condition relative to the incidence light IL (reference to FIG. 1) is obtained.

By making the surface 316C be the flat surface which is disposed at the angle at which the total reflection condition relative to the incidence light IL is obtained, it is possible to increase the reflection efficiency of the reflection surface to approximately 100%, and the utilization efficiency of the light is further improved.

That is, since the surface 316C of the above-described second prism 316 can totally reflect the light of the second wavelength, the surface 316C functions as a harmonics optical-path conversion section which converts the optical-path of the light of the second wavelength that was separated at the selective reflection film 317.

As the harmonics optical-path conversion section, a reflection film may be provided on the surface 316C. By the reflection film, the harmonics optical-path conversion section may lead the second laser light LS2 to tend toward the substantially same direction of travel of the first laser light LS1.

In this structure, there is a possibility that the reflection efficiency may slightly decrease. However, it is not necessity to dispose the surface 316A at an angle at which the total reflection condition is obtained in this structure. Therefore, the degree of freedom in design the optical-path increases.

The prisms 315 and 316 are integrated into a unit body by connecting each other.

The prisms 315 and 316 may be integrated into a unit body by another connection method.

The selective reflection film 317 may also be formed on the surface 315B of the prism 315 instead of on the surface 316B of the prism 316.

In short, ft is sufficient that the selective reflection film 317 be formed between the surface 315B of the prism 315 and the surface 316B of the prism 316.

In addition, an anti-reflective film (AR film) may be formed on the surface 315A of the prism 315 and the surface 316A of the prism 316.

By forming the AR films on these surfaces, it is possible to decrease the light loss when the light is incident into the optical-path conversion element 314 via the AR film or when the light is emitted from the optical-path conversion element 314 via the AR film.

Next, the process in which output light is obtained from the laser light source device 31 will be described.

The light source 311 emits light of the first wavelength when a current is applied to the laser medium 311B.

The light of the first wavelength emitted from the light source 311 is incident into the surface 315A of the prism 315. In this manner, the light is incident into the optical-path conversion element 314. After the light was totally reflected by the surface 315C of the prism 315, the light passes through the surface 315B of the prism 315, passes through the selective reflection film 317 and the surface 316B of the prism 316 in sequence, and emits from the surface 316A of the prism 316 toward the wavelength conversion element 312.

The light of the first wavelength emitted from the optical-path conversion element 314 is incident into the wavelength conversion element 312.

In the wavelength conversion element 312, a part of the incident light of the first wavelength is converted into a light including a light with the second wavelength which is half of that of the first wavelength.

In the light emitted from the wavelength conversion element 312, the light that has a wavelength which has been converted into the second wavelength passes through the external resonator 313, and emits from the external resonator 313 as the first laser light LS1.

Additionally, in the light emitted from the wavelength conversion element 312, the light (light of the first wavelength) which has not been converted into light of the second wavelength is reflected by the external resonator 313 toward the light source 311.

The light of the first wavelength which has been reflected by the external resonator 313 re-passes through the wavelength conversion element 312 in the process of traveling to the light source 311. In addition, a part of the light is converted into light of the second wavelength.

The light emitted from the wavelength conversion element 312 toward the light source 311 is incident into the optical-path conversion element 314 via the surface 316A of the prism 316, and is incident into the selective reflection film 317.

In the light which has been incident into the selective reflection film 317 in this manner, the light of the first wavelength passes through the selective reflection film 317.

The light of the first wavelength which has passed through the selective reflection film 317 passes the surface 315B of the prism 315. After total reflection by the surface 315C of the prism 315, the light is emitted from the surface 315A of the prism 315 toward the light source 311.

Furthermore, the light is returned to the light source 311, reflected by the mirror layer 311A, and re-emitted from the light source 311.

As described above, the light of the first wavelength oscillates on the first optical-path O1 formed between the light source 311 and the external resonator 313. The light is thereby amplified by resonation with the light newly oscillated in the laser medium 311B.

That is, the laser light source device 31 includes a resonator structure formed between the mirror layer 311A of the light source 311 and the external resonator 313.

The light, which has been converted into light of the second wavelength by the wavelength conversion element 312 in the process of traveling to the light source 311, is reflected by the selective reflection film 317.

In addition, the light is reflected by the surface 316C of the prism 316, which is a reflective surface, thereby led in a direction substantially parallel to the direction of travel of the first laser light LS1, and emitted from the surface 316A of the prism 316. The light is the second laser light LS2.

That is, the optical-path conversion element 314 has the functions of extracting the light, which has been converted into the second wavelength in the process of traveling to the light source 311 due to the reflection from the external resonator 313, from the first optical-path O1 to the second optical-path O2 which is different from the first optical-path O1.

In addition, in the limited cases in which the above-described functions are achieved, the structure including prisms formed in forms other than the above-described first prism 315 and second prism 316 may be used as the optical-path conversion element 314.

In FIG. 1, L1 indicates the light which has been emitted from the light source 311, which has been converted into light of the second wavelength by the wavelength conversion element 312, and which is emitted from the external resonator 313 as the first laser light.

The optical-path O1 indicates the light which has not been converted into the second wavelength light by the wavelength conversion element 312 after emission from the light source 311, which also has not been converted into the second wavelength light by the wavelength conversion element 312 in the processes from the reflection from the external resonator 313 toward the light source 311, and which is returned to the light source 311 by passing the selective reflection film 317.

Furthermore, L2 indicates the light which has been emitted from the light source 311, has not been converted into the second wavelength light by the wavelength conversion element 312, has been converted into the second wavelength light by the wavelength conversion element 312 in the processes from the reflection from the external resonator 313 to the return to the light source 311, and is incident into the selective reflection film 317.

In FIG. 1, L1, O1, and L2 appropriately indicate the different positions. However, these are referred to actually exist at identical positions.

Next, the relationship between the distance between the first laser light LS1 and the second laser light LS2, and the width of the wavelength conversion element 312 and the external resonator 313 is explained with reference to the FIG. 1.

In FIG. 1, reference numeral W1 indicates the height of the wavelength conversion element 312, in other words, indicating the length of the wavelength conversion element 312 in a direction parallel to the line (not shown) orthogonal to the optical-axes (first laser light LS1 and second laser light LS2) of lights passing through the inner wavelength conversion element 312.

Reference numeral W2 indicates the distance between the optical-axis of the first laser light LS1 on the end face of the wavelength conversion element 312 which is close to the external resonator 313 and the optical-axis of the second laser light LS2.

The laser light source device of this embodiment includes an optical-path adjustment section. The optical-path adjustment section adjusts the optical-path of the light source 311 so as to output the first laser light LS1 from a predetermined position of the wavelength conversion element 312.

In this embodiment, the first prism 315 constituting the optical-path conversion element 314 includes the optical-path adjustment section.

That is, the optical-path adjustment section constitutes a part of the optical-path conversion element 314.

As shown in FIG. 1, the first prism 315 includes a foundation section 315D (optical-path adjustment section) which causes the surfaces 315B and 315C functioning as the fundamental-wave conversion section to be positioned at a predetermined height.

In the above-described constitution, in the laser light source device 31 of the embodiment, the relationship W2<W1 is satisfied.

Specifically, W1 is 0.5 mm, and W2 is 0.3 mm.

Furthermore, as described above, the first prism 315 (optical-path conversion element 314) and the wavelength conversion element 312 are held onto the base section B.

In addition, the first laser light LS1 passes through the inner wavelength conversion element and between the center section CL and the optical-path of the second laser light LS2.

In other words, the first laser light LS1 passes between the center section CL of the wavelength conversion element 312 and the top face (face opposite the holding face 312D) of the wavelength conversion element 312.

In this constitution, it is possible to allow the first laser light LS1 to be close to the second laser light LS2, while the optical-path of the first laser light LS1 is passing through the inner wavelength conversion element 312, and while the optical-path of the second laser light LS2 is passing outside the wavelength conversion element 312.

Furthermore, in FIG. 1, reference numeral W3 indicates the height of the external resonator 313, in other words, indicating the length of the external resonator 313 in a direction parallel to the line orthogonal to the first laser light LS1 passing through the external resonator 313.

In the laser light source device 31 of this embodiment, the relationship W2<W3 is satisfied in addition to the above-described relationship (W2<W1).

In addition, in this embodiment, as shown in FIG. 1, W1<W3 is consistent.

Specifically, the W3 is 1.2 mm.

Furthermore, in FIG. 1, reference numeral W4 indicates the length of the optical-path conversion element 314 in the direction of the beam of the second laser light LS2 emitted from the optical-path conversion element 314.

Reference numeral W5 indicates the height of the optical-path conversion element 314, in other words, indicating the length of the optical-path conversion element 314 in a direction parallel to the line orthogonal to the light axis of the light (laser light LS1) passing through the inner optical-path conversion element 314.

In the laser light source device 31 of this embodiment, the relationship W4<W5 is satisfied.

Specifically, the W4 is 7 mm. The W5 is, for example, substantially 10 mm.

In conventional laser light source devices, by disposing an external resonator at the position at which the light emitted from a light source is focused, improvement of utilization efficiency of the light is attempted. Therefore, the wavelength conversion element provided between the external resonator and the light source is restricted in size. By extending the length of the wavelength conversion element through which the light passes, that is, by extending the length of the optical-path in the wavelength conversion element, wavelength conversion efficiency is improved.

Thus, in laser light source devices, it is desirable that the length of the optical-path in the direction of the laser light LS1 and LS2 of the wavelength conversion element be as great as possible.

In contrast, according to the laser light source device 31 of this embodiment, since the above-described relationship (W4<W5) is satisfied in the optical-path conversion element 314, the size of optical-path conversion element 314 is suppressed in the direction of length of the optical-path of the wavelength conversion element 312. It is thereby possible to enlarge the wavelength conversion element 312 as much as possible. Furthermore, corresponding to the above, it is possible to reliably obtain elongation of the length of the wavelength conversion optical-path in the wavelength conversion element 312. The conversion efficiency of light being converted into the second wavelength in the wavelength conversion element 312 is thereby improved, and the light utilisation efficiency is advanced.

Regarding to a concrete dimension of the laser light source device 31, the width of the wavelength conversion element 312 in a direction of length of the optical-path is 5 mm.

Furthermore, the length of the optical-path (distance between the surface of an anti-reflection 313B of the external resonator 313 and the surface 316A of the optical-path conversion element 314) of the light, which is emitted from the optical-path conversion element 314 and reaches the external resonator 313, is set to 8.5 mm.

In the laser light source device 31 of this embodiment, it is possible to obtain the effects described below.

(1) Since the wavelength conversion element 312 is provided in the resonator structure (first optical-path O1) constituted by the light source 311 and the external resonator 313, it is possible to utilize the second laser light by extracting the second laser light which has been converted into the second wavelength in the process of traveling to the light source 311 due to the reflection from the external resonator 313, from the first optical-path O1 to the second optical-path O2, using the optical-path conversion element 314. It is thereby possible to efficiently prevent power reduction of the output light.

Furthermore, since the wavelength conversion element 312 is provided in the inner resonator structure constituted by the light source 311 and the external resonator 313, a structure is not necessary to lead the light so that the light does not return to the light source 311, the light having not been converted into a light of the second wavelength while traveling to the light source 311 due to the reflection from the external resonator 313.

Thus, there is little concern that the optical system will increase in size, and it is possible to decrease the light loss caused by extending the length of the optical-path or by increasing the number of times the light passes through the optical elements.

Furthermore, since it is sufficient that the second laser light LS2 is led only in substantially the same direction as the direction of travel of the first laser light LS1, it is thereby possible to obtain output light in which the polarization directions are almost identical.

It is also thereby possible to improve the light utilization efficiency even if the laser light source device is used in combination with a polarization-controller-type device (e.g., liquid crystal device).

(2) As described above, since the optical-path conversion element 314 includes the optical-path adjustment section adjusting the optical-path of the light source 311 so that the first laser light is output from the predetermined position of the wavelength conversion element 312, it is possible to obtain a constitution in which the above-described relationship W2<W1 is satisfied.

The distance between the second laser light LS2 and the first laser light LS1 can thereby be shortened.

Furthermore, for example, when a diffusion optical member 50 is located in advance of the two laser lights LS1 and LS2, it is possible to reduce the size of the diffusion optical member 50.

Therefore, the light that is emitted through the diffusion optical member 50 whose size is reduced can obtain a high level of image quality, and an illumination device which can obtain clean illumination with a high level of light utilization efficiency can be provided.

Furthermore, since the optical-path adjustment section (foundation section 315D) described above is included, it is possible to lead light of the first wavelength, and make the first laser light LS1 pass through the predetermined position in which the pitch of the polarization inversion is stabilized in the wavelength conversion element 312, it is possible to improve the reliability of the laser light source device 31.

Furthermore, according to the invention, even if the bottom side portion of the light source 311, the external resonator 313, the wavelength conversion element 312, and the optical-path conversion element 314 are connected to the base section B via the adhesive C, malfunctions, such as the interception of the optical-path due to the adhesive C, do not occur, and reduction of the yield caused by the malfunctions can be prevented.

Therefore, it is possible to reduce the size of the diffusion optical member 50 which is used in combination with the laser light source device. In addition, a high level of light utilization efficiency in the laser light source device 31 can be achieved, in which the output light has a completed polarization direction, the output is stabilized, and the power reduction of the output light is efficiently suppressed.

(3) since the relationship W2<W3 is further satisfied in addition to the above-described relationship (W2<W1), it is possible to avoid reduction of transmissivity of the optical member that is disposed in the optical-path, caused by the effect of an adhesive or a holding member which holds the bottom side portion of the external resonator. It is thereby possible to further improve the light utilization efficiency.

In addition, the external resonator 313 needs to align the reflection face of the external resonator 313 with the light source, based on the length in the direction of a beam and reflection angle, while it is easy to fix the external resonator 313 and the light source at a desired angle while easily aligning the external resonator 313 and the light source, and it is possible to prevent interception of the second laser light LS2.

(4) Since it is possible to both make the light incident into the optical-path conversion element 314 via the surfaces 315A and 316A of the prisms 315 and 316, respectively, and cause the tight to emit from the optical-path conversion element 314, it is possible to easily control the direction of the light which is incident into the optical-path conversion, element 314, and the direction of the light which is emitted from the optical-path conversion element 314.

(5) Conventionally, there is a high possibility that the laser light source device 31 will be used in combination with other optical devices such as diffusion optical members, lenses, filters, mirrors, diffraction gratings, prisms, light modulation elements, and the like. However, the characteristics of these optical devices are variable depending on the angle of the incidence light and the output results.

Furthermore, illumination loss occurs for obtaining margin in irregularities of illumination region, caused by irregularities of the angles of the incidence light.

However, in the laser light source device 31 of this embodiment, since the second laser light LS2 is substantially parallel to the first laser light LS1 emitted from the external resonator 313, it is thereby easy to design an optical device or to determine the position of an optical device, which is disposed behind the laser light source device 31.

Therefore, when the laser light source device 31 of this embodiment is applied to an image display device, a monitor device, or the like, it is possible to obtain effects where the degree of freedom in optical design increases dramatically.

Furthermore, since the illumination region which is obtained in advance of the diffusion optical member is formed on the region which is depended on the incidence angle of the laser beam, it is possible to illuminate the substantially same region, and it is possible to illuminate a desired area with a high level of illumination efficiency.

Second Embodiment

Figure 6:
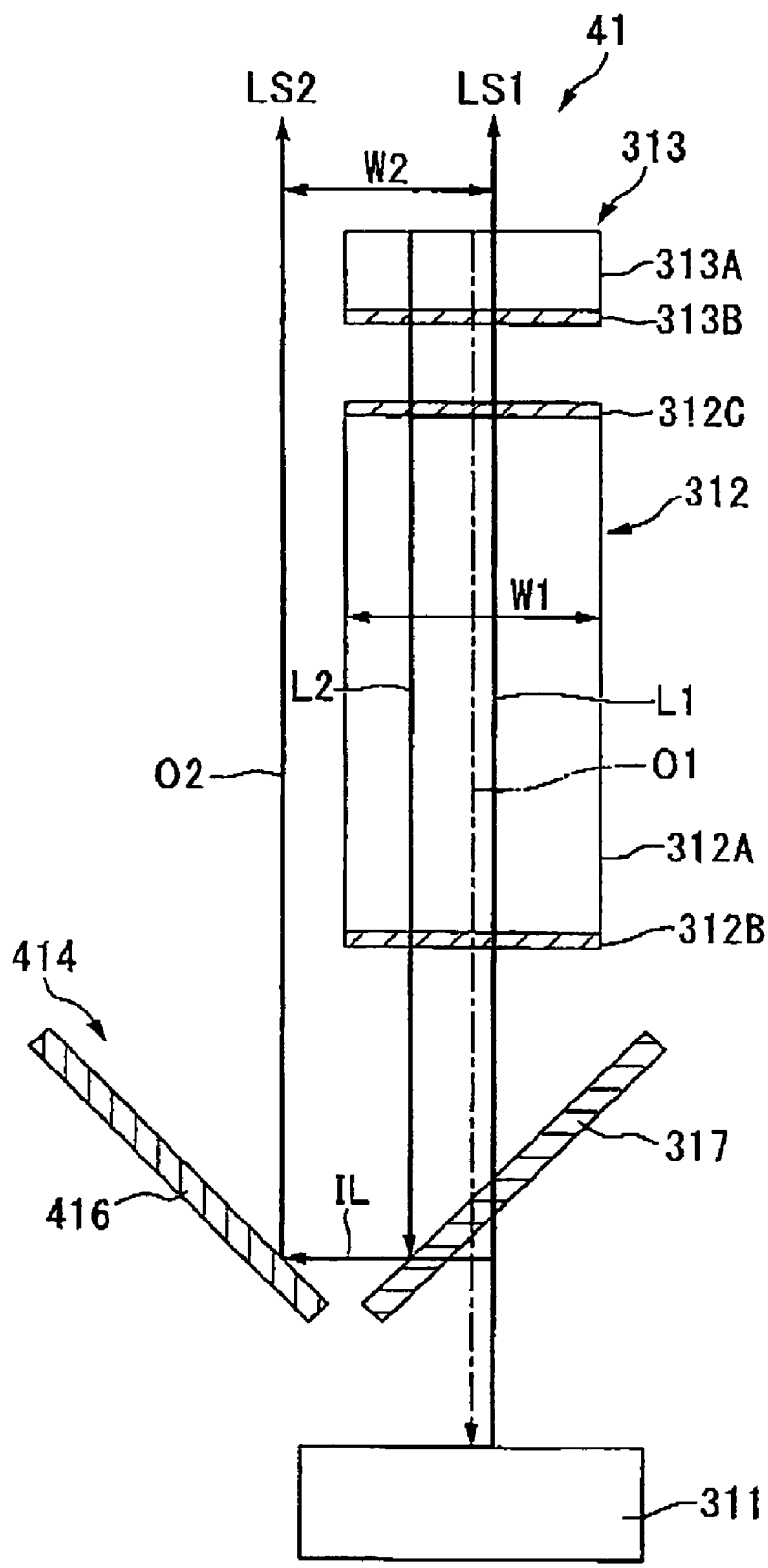
FIG. 6 is a schematic view of a constitution of a laser light source device of a second embodiment.

FIG. 6 is a schematic view showing the constitution of a laser light source device of a second embodiment.

The laser light source device 41 of the second embodiment is different from the laser light source device 31 of the first embodiment with regard to only the constitution of an optical-path conversion element 414. The other elements are the same as the first embodiment.

Therefore, in FIG. 6, identical symbols are used for the elements which are identical to those of the first embodiment and the explanations thereof are omitted or simplified.

In addition, the process in which the output light is obtained from the laser light source device 41 is also the same as in the first embodiment and the explanations thereof are omitted or simplified.

In the laser light source device 41, as shown in FIG. 6, an optical-path conversion element 414 includes a platy member (not shown) which is a translucent member, the selective reflection film 317, and a reflection mirror 416.

The selective reflection film 317 is formed on a first surface of the platy member, and the reflection mirror 416 is provided on a second surface of the platy member.

Similarly to the selective reflection film 317, the reflection mirror 416 can be constituted by a dielectric multilayer.

Here, the dielectric multilayer constituting the reflection mirror 416 may be a dielectric multilayer different from or the same as the selective reflection film 317.

Furthermore, the reflection mirror 416 may be constituted from a metal film such as aluminium, chrome, or argentum.

Generally, the dielectric multilayer has superior heat resistance compared with the metal film.

The dielectric multilayer can improve reflectance relative to the light of the specific wavelength by optimizing the thickness of each layer constituting the dielectric multilayer, the material of each layer, and the number of layers, and is also suitable to efficiently reflect light having a high level of directivity whose wavelength-band is narrow like a laser.

In contrast, the metal film is more advantageous than the dielectric multilayer with regard to the cost.

It is preferable that anti-reflective films (AR films) be formed on the surfaces opposite to the surfaces on which the selective reflection film 317 and the reflection mirror 416 are formed.

By forming the AR films on the surfaces, it is possible to decrease light loss when the light is incident into the optical-path conversion element 414 via the surfaces, or when light is emitted from the optical-path conversion element 414 via the surfaces.

Next, the process in which output light is obtained from the laser light source device 41 will be described with reference to FIG. 6.

The light source 311 emits light of a first wavelength.

The light of the first wavelength emitted from the light source 311 is incident into the optical-path conversion element 414, passes through the selective reflection film 317, and is emitted toward the wavelength conversion element 312.

That is, in the laser light source device 41 of this embodiment, a light emission surface of the light source 311 is arranged so as to substantially face the AR film 312B of the wavelength conversion element 312.

The light of the first wavelength emitted from the optical-path conversion element 414 is incident into the wavelength conversion element 312.

In the wavelength conversion element 312, a wavelength of a part of the light of the first wavelength that has been incident is converted into light half the wavelength (second wavelength) of the light.

In the light emitted from the wavelength conversion element 312, the light that has been converted into the second wavelength passes through the external resonator 313, and is emitted from the external resonator 313 as the first laser light LS1.

In contrast, in the light emitted from the wavelength conversion element 312, the light (light of the first wavelength) that has not been converted into the second wavelength is reflected by the external resonator 313 toward the light source 311.

The light of the first wavelength which has been reflected by the external resonator 313 re-passes through the wavelength conversion element 312 in the process of traveling to the light source 311. In addition, a part of the light is converted into light of the second wavelength.

The light emitted from the wavelength conversion element 312 toward the light source 311 is incident into the selective reflection film 317.

In the light which has been incident into the selective reflection film 317 in this manner, the light of the first wavelength passes through the selective reflection film 317.

The light of the first wavelength which has passed through the selective reflection film 317 emitted from the optical-path conversion element 414 toward the light source 311.

Furthermore, the light is returned to the light source 311, reflected by the mirror layer formed therein, and re-emitted from the light source 311.

As described above, the light of the first wavelength oscillates on the first optical-path O1 formed between the light source 311 and the external resonator 313. The light is thereby amplified by resonation with the light newly oscillated in the laser medium 311B.

That is, the laser light source device 41 includes a resonator structure formed between the mirror layer inside the light source 311 and the external resonator 313.

In contrast, the light, which has been converted into light of the second wavelength by the wavelength conversion element 312 in the process of traveling to the light source 311 due to the reflection from the external resonator 313, is reflected by the selective reflection film 317.

In addition, the light is reflected by a reflection mirror 416, thereby led in a direction substantially parallel to the direction of travel of the first laser light LS1, and emitted as the second laser light LS2.

According to the laser light source device 41 of this embodiment, it is also possible to obtain the effects described below in addition to the above-described effects (1), (2), and (4) to (6) of the first embodiment.

It is possible to obtain the optical-path conversion element 414 which is more lightweight than when a prism is used as a translucent member.

In addition, the platy member is more easily fabricated than the prism.

It is thereby possible to allow the laser light source device to be lightweight and to reduce the cost.

Modified Example of Embodiment

The invention shall not be limited to the above-described first and second embodiments. As a matter of course, the invention may include various modifications of the embodiment in a scope not deviating from the spirit of this invention.

In the configuration described below as a modified example, it is also possible to obtain the same effects as the above-described embodiments.

Instead of the above-described surface emission-type semiconductor laser, such as the light source 311, a laser light source such as an edge-emission-type laser or a solid laser excited by laser diodes can be used.

When using the edge-emission-type laser, it is preferable that a lens causing the light emitted from the light source 311 to collimate be disposed between the light source 311 and the optical-path conversion elements 314 and 414.

As the light source 311, a laser light source including a plurality of arrayed emission sections may be used.

Figure 7A:
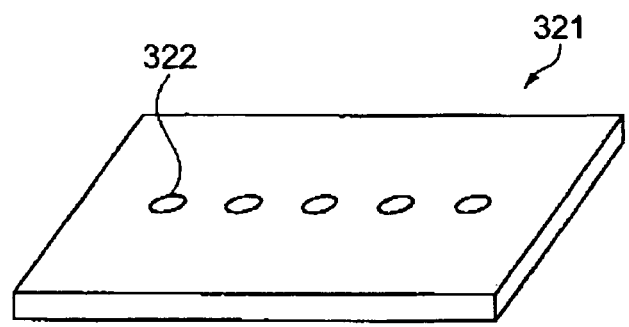
FIGS. 7A and 7B are schematic perspective views showing a constitution of light source having a plurality of arrayed emission sections.
Figure 7B:
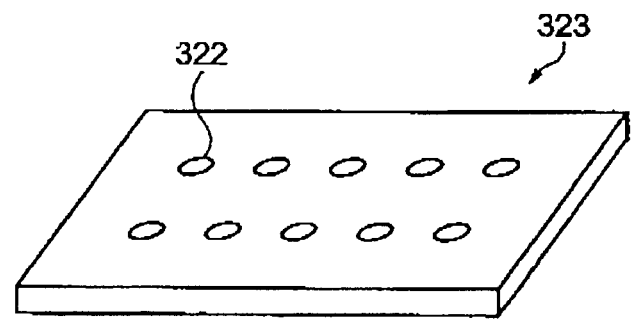

FIGS. 7A and 7B are schematic perspective views showing the light source in which emission sections are arrayed.

In the laser light source 321, as shown in FIG. 7A, a plurality of emission sections 322 is arrayed in a line.

In the laser light source 323 as shown in FIG. 7B, a plurality of emission sections 322 is also arrayed in two lines.

The number of emission sections and the number of lines of emission sections are not limited to that shown in FIGS. 7A and 7B.

When the tight source including the arrayed emission sections is applied to the above-described laser light source devices 31 and 41, the area of the emission end face (incidence end face) of the selective reflection film, the reflection surface, the wavelength selective element, and the external resonator, is suitably extended as needed depending on the area of the arrayed emission sections.

Therefore, in the above-described laser light source devices 31 and 41, even if the light source includes the arrayed emission sections, the laser light source devices 31 and 41 do not need to be increased in size, and it is possible to utilize a simple constitution.

Therefore, in the above-described laser light source devices 31 and 41, even if the light source is an array, it is possible to efficiently improve the output power of the output light by increasing the amount of light due to the arrayed light source, while obtaining the effects in which power reduction of the output light can be efficiently suppressed, light utilization efficiency can be improved, the output light has a completed polarization direction, and the output can be stabilized.

In the above explanation, as the nonlinear optical material constituting the wavelength conversion element 312, materials such as LN (LiNbO$_3$) or LT (LiTaO$_3$) are used. As for the other materials constituting the wavelength conversion element 312, inorganic nonlinear optical material such as KNbO$_3$, BNN (Ba$_2$NaNb$_5$O$_{15}$), KTP (KTiOPO$_4$), KTA (KTiOAsO$_4$), BBO ($\beta$-BaB$_2$O$_4$), LBO (LiB$_3$O$_7$), and the like can be used.

Furthermore, low-molecular organic material such as metanitroaniline, 2-methyl-4-nitroaniline, chalcone, dicyanovinylanisole, 3,5-dimethyl-1-(4-nitrophenyl)pyrazole, N-methoxymethyl-4-nitroaniline, the like, or organic nonlinear optical material such as poled polymer or the like may be used.

As the wavelength conversion element 312, a Third Harmonic Generation element may be used instead of the above-described SHG element.

As the external resonator 313, not only the above-described volume phase grating, but also a crystal-type volume hologram, a Photopolymer volume hologram, a blazed diffraction grating (diffraction grating whose groove is formed in a serration form in a cross-sectional view), or the like may be used.

In the constitution of the above-described embodiment, the external resonator 313 performs the wavelength-selection and causes the visible light to pass through. However, as shown in FIG. 8, the above-described resonator may be constituted by in combination with a band-pass filter BP and a wide-band mirror M.

The band-pass filter BP is the filter which causes a wavelength or a wavelength-band to pass through, and reflects the light having the wavelength shorter than the wavelength-band and the wavelength longer than the wavelength-band.

Figure 8:
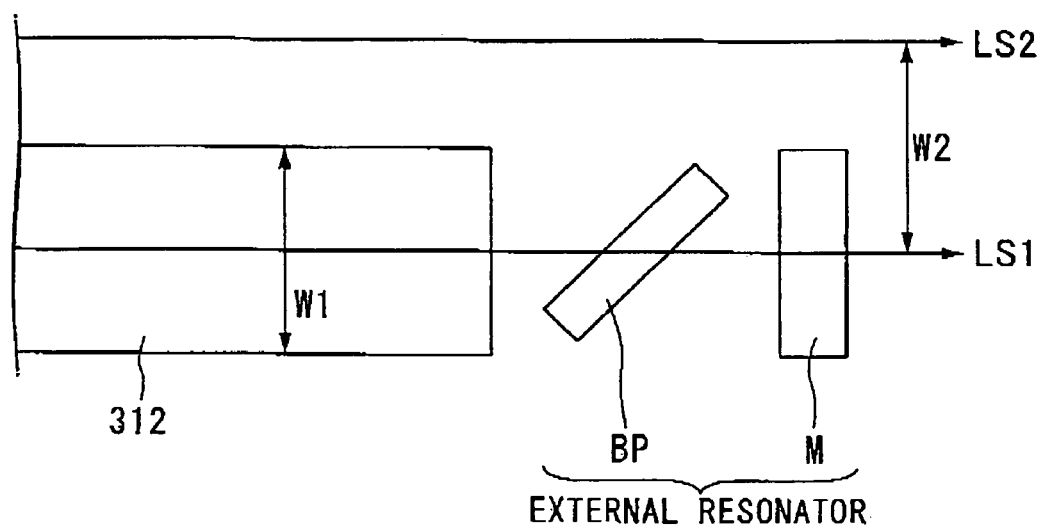
FIG. 8 is a schematic cross-sectional view showing a constitution of an external resonator of a modified example.

Furthermore, as shown in FIG. 8, a transmission wavelength is adjusted by varying the incidence angle of the light, and the wavelength-selection is performed.

In this case, the wavelength-selection is performed by the band-pass filter BP, and the wide-band mirror M functions as the mirror through which the visible light passes.

In this case, the height W3 of the external resonator as shown in FIG. 1 corresponds to the width of the wide-band mirror M.

Illumination Device

As an illumination device of an embodiment of the invention, such as the constitution of the illumination device 500 to which, for example, the above-described laser light source device 41 is applied, will be described below.

Figure 9:
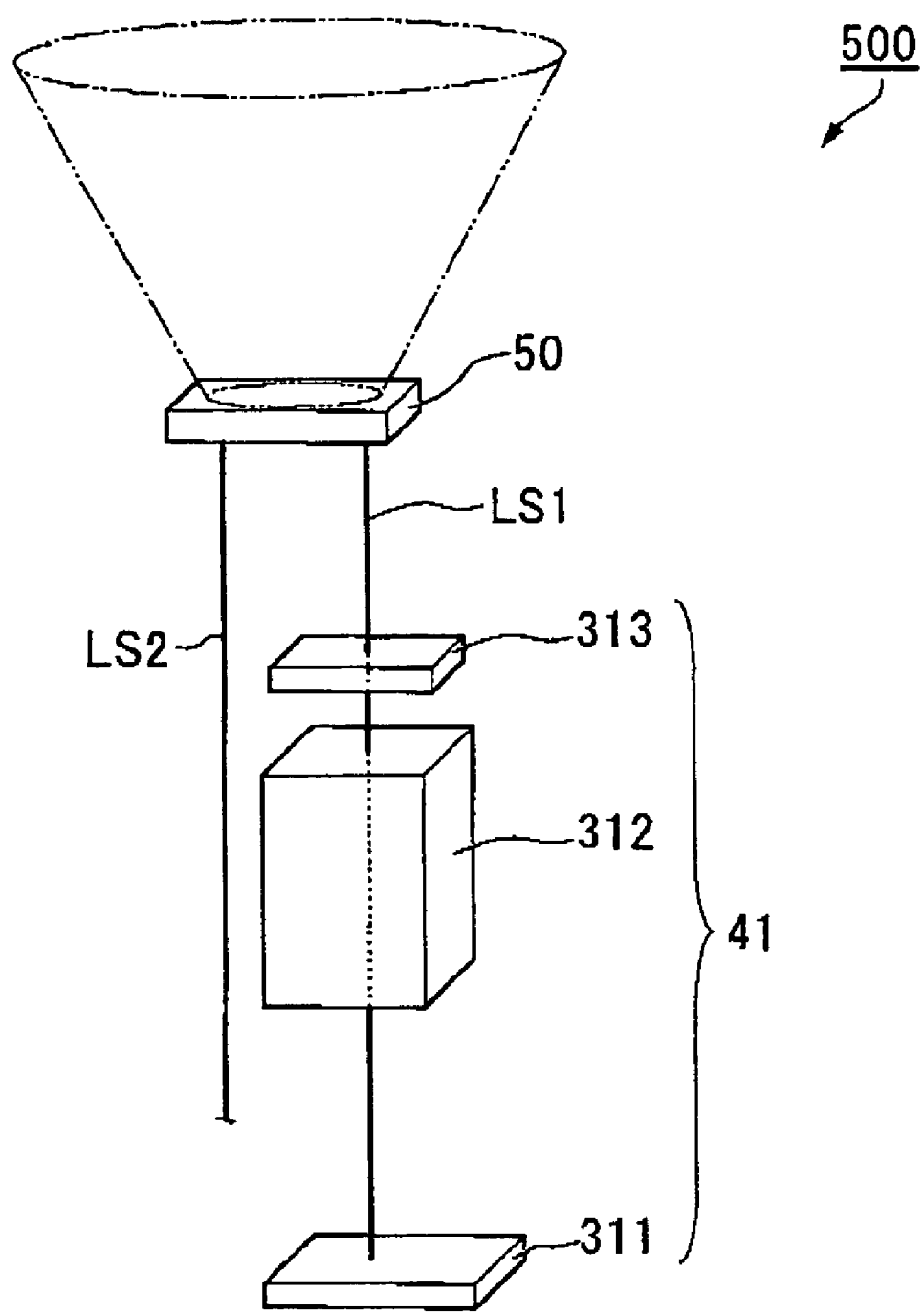
FIG. 9 is a schematic perspective view showing a constitution of an illumination device.

FIG. 9 is a schematic view showing a constitution of an illumination device 500.

Illustrations are simplified in the FIG. 9, and the optical-path conversion element 414 is omitted.

As shown in FIG. 9, the illumination device 500 includes the laser light source device 41, and a diffusion optical member 50 diffusing the light emitted from the laser light source device 41 and uniformizing the illumination distribution of the laser light.

The diffusion optical member 50 is constituted by a hologram element.

As the hologram element, a computer generated hologram (CGH) may be used on the basis of calculation using a calculator. The computer generated hologram is formed with interference fringes, which are artificially created on a hologram plate.

The computer generated hologram is suitable because a divided region of a diffraction grating can be freely set, and aberration does not therefore occur.

Generally, in the diffusion optical member 50 constituted by the computer generated hologram, irregularities are occurred caused by, for example, errors in production or the like, clean so light may not thereby be obtained.

Such phenomenon will be specifically distinguished when the diffusion optical member is enlarged.

A small sized diffusion optical member has a high level of image quality of light, and can perform the irradiation with the clean light having uniformized illumination distribution onto an object.

That is, reduction of the size of the diffusion optical member is desired.

Therefore, since the illumination device 500 of this embodiment includes the above-described laser light source device 41, the size of the diffusion optical member 14 can be reduced, and the image quality of the light is enhanced.

Therefore, the illumination device which can illuminate a projection object with light having a clear and uniform illumination distribution, and which has high performance can be realized.

Image Display Device

As an image display device of an embodiment constitution of the projector 3 to which the above-described laser light source device 31 of the first embodiment is applied, will be described below.

Figure 10:
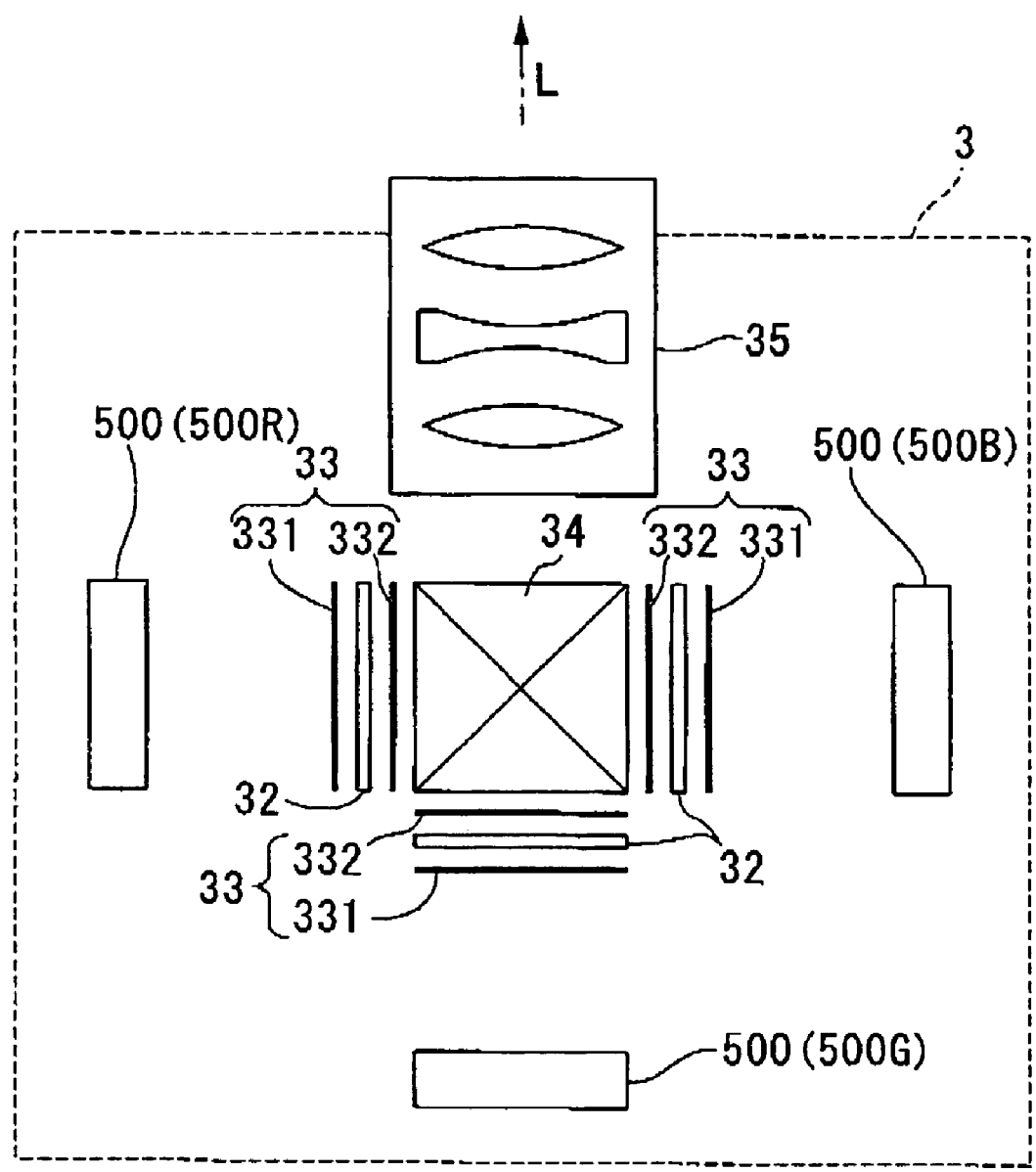
FIG. 10 is a schematic view showing a constitution of an optical system of a projector.

FIG. 10 is a schematic view showing the constitution of an optical system of a projector 3.

In FIG. 10, the projector 3 includes the above-described illumination device 500 which is the light source section, a liquid crystal panel 32 (light modulation element) which is a light modulation device, polarization plates 331 and 332, a cross-dichroic prism 34, a projection lens 35, and the like.

A liquid crystal light valve 33 is constituted by the liquid crystal panel 32, the incidence polarization plate 331 disposed on the surface of liquid crystal panel 32 into which light is incident, and the emission polarization plate 332 disposed on the surface of liquid crystal panel 32 from which the light is emitted.

The illumination device 500 is constituted by a red-colored light source 500R emitting a red-colored laser light, a blue-colored light source 500B emitting a blue-colored laser light, and a green-colored light source 500G emitting a green-colored laser light.

These light sources 500R, 500G, and 500B are disposed so as to each face one of the three side surfaces of the cross-dichroic prism 34.

In the FIG. 10, the red-colored light source 500R and the blue-colored light source 500B are disposed so as to be on opposite sides of, and sandwiching the cross-dichroic prism 34. Also, the projection lens 35 and the green-colored light source 500G are disposed so as to be on opposite sides of and sandwiching the cross-dichroic prism 34. These positions are each changeable, as needed.

The liquid crystal panel 32 includes switching elements such as a poly-silicon TFT (Thin Film Transistor).

Each colored light emitted from the illumination device 500 is incident into the liquid crystal panel 32 via the incidence polarization plate 331.

The light which has been incident into the liquid crystal panel 32 is modulated depending on image information. The modulated light is thereby emitted from the liquid crystal panel 32.

Specified linearly polarized light in the light modulated by the liquid crystal panel 32 passes through the emission polarization plate 332, and goes toward the cross-dichroic prism 34.

The cross-dichroic prism 34 is the optical element synthesizing the colored lights which have been modulated by liquid crystal panels 32 and forming a color image.

The cross cross-dichroic prism 34 is formed by connecting four right-angle prisms. The cross-dichroic prism 34 is formed by pasting four right-angle prisms, in a substantially regular square in a plan view.

Two-type dielectric multi layers are formed in the shape of X on a boundary face of the prisms.

These dielectric multi layers reflect each colored light emitted from the liquid crystal panels 32 which are disposed so as to be opposite each other, and cause the light emitted from the liquid crystal panel 32 disposed so as to be opposite the projection lens 35 to pass therethrough.

In this manner, each colored light that has been modulated in the liquid crystal panel 32 is synthesized, and the color image is formed.

The projection lens 35 is constituted as an integrated lens combined with a plurality of lenses.

The projection lens 35 projects and enlarges the color image L.

According to the projector 3 of this embodiment, since the illumination device including the above-described laser light source device, is used as the light source section, a high level of light utilization efficiency is obtained.

In this embodiment, the above-described illumination device 500 (500R, 500G, 500B) are used. However, one or all of them may be substituted with the laser light source device 31 of the other embodiment or the laser light source device of the above-described modified example.

In this embodiment, the example of projector including three light modulation elements is explained. However, the constitution described in this embodiment can be applied to a projector including one, two, or more man four light modulation devices.

Also, in this embodiment, the transmission-type projector is explained. The illumination device 500 or the laser light source devices 31 and 41 constituting the illumination device can also be applied to a reflection-type projector.

Here, the "transmission-type projector" means the projector including the tight modulation element through which the light passes. The "reflection-type projector" means the projector including the light modulation element in which the light reflects.

As the light modulation element, not only the liquid crystal panel 32, but also a device including, for example, a micromirror may be used.

Furthermore, as the projector, a front projection-type projector in which an image is projected onto a screen from the viewer side of the screen, and a rear projection-type projector in which an image is projected onto a screen from the opposite side of the viewer side of the screen, are both well-known. The illumination device 500 or the laser light source devices 31 and 41 constituting the illumination device can be applied to both the front projection-type projector and the rear projection-type projector.

Furthermore, in this embodiment, as an example of the image display device including the illumination device 500, the projector that includes the projection lens 35 magnifying and projecting an image is introduced, however, an image display device that does not include the projection lens 35 can also be applied thereto. In addition, an image display device including the laser light source devices 31 and 41 of the first and second embodiment and the modified example thereof can also be applied thereto.

In addition, the laser light source device of the invention can also be applied to the image display device in which an image is displayed by a scanning section that scans an image onto a screen with the laser light from the laser light source device.

Monitor Device

Finally, an example constitution of the monitor device 40 including the above-described laser light source device 31, will be described below.

Figure 11:
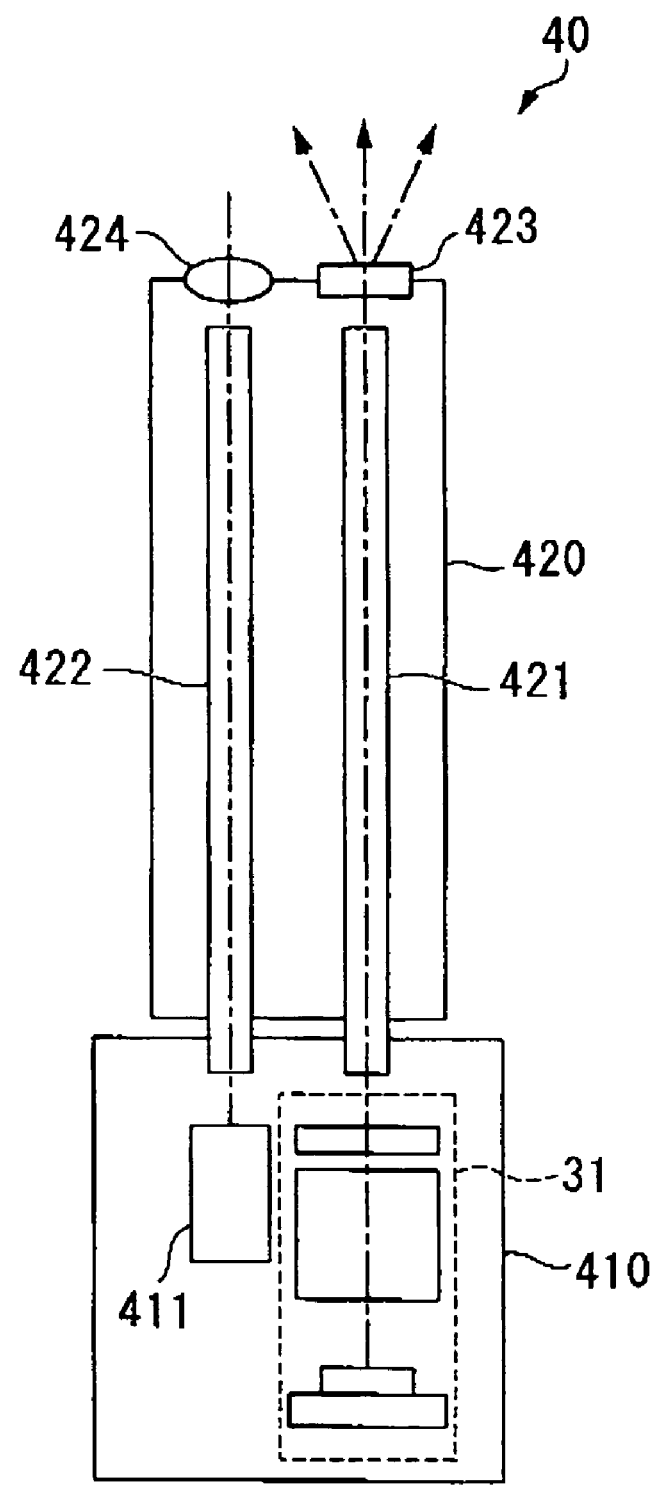
FIG. 11 is a schematic view showing a constitution of a monitor device.

FIG. 11 is a schematic view showing a monitor device.

The monitor device 40 includes a main body 410 and a light transmission section 420.

The main body 410 includes the laser light source device 31 of the first embodiment described above.

The light transmission section 420 includes a light guide 421 transmitting light and a light guide 422 receiving light.

Each of the light guides 421 and 422 is constituted from a plurality of optical fibers that are sheaved. Therefore, it is possible to transmit the laser light a distance.

The laser light source device 31 is disposed at the position which is close to the incidence end face of the transmitting light guide 421. A diffusing plate 423 is disposed at the position which is close to the emission end face of the transmitting light guide 421.

The laser light emitted from the laser light source device 31 is transmitted through the light guide 421 and the diffusing plate 423 disposed at the end of the light transmission section 420, and is diffused by the diffusing plate 423. Therefore, the laser light illuminates an object.

Also, since an image-formation lens 424 is disposed at the end of the light transmission section 420, the image-formation lens 424 can receive the reflection light reflected by the object.

The received reflection light is transmitted through the receiving light guide 422 and to a camera 411 which is an image capturing section formed in the main body 410.

As a result, due to the laser light emitted from the laser light source device 31, the object is illuminated, the reflection light reflected by the object is obtained, and the image formed from the reflection light can be captured by the camera 411.

According to the monitor device 40 constituted as described above, since the laser light source device 31 can illuminate an object with the light having a high level of light utilization efficiency, it is possible to improve the brightness of the image captured by the camera 411.

In the monitor device 40 of this embodiment, the monitor device 40 uses the laser light source device 31 of the first embodiment. However, instead of the laser light source device 31, the laser light source device 41 described in the other embodiments or the laser light source device of the modified examples may be used.

Furthermore, the illumination device, including the laser light source devices 31 and 41 or the laser light source device of the modified examples thereof, may be used.

Third Embodiment

Figures 12A, 12B:
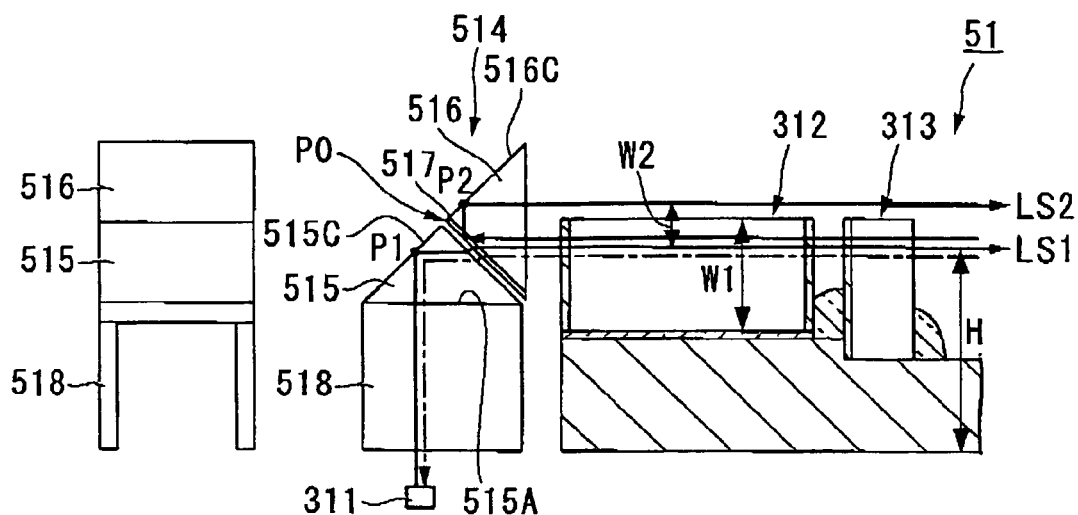
FIGS. 12A and 12B are schematic views showing constitutions of laser light source devices of a third embodiment.

FIGS. 12A and 12B are schematic views showing the constitution of a laser light source device 51 of a third embodiment. FIG. 12A is a side view showing the laser light source device 51. FIG. 12B is a cross-sectional view illustrating the optical-path in the laser light source device 51.

The laser light source device 51 of the third embodiment includes a support member 518 which supports an optical-path conversion element 514, and which is an optical-path adjustment section. The other elements are similar to the above-described first and second embodiments.

Therefore, in FIGS. 12A and 12B, identical symbols are used for the elements which are identical to those of the above-described embodiments, and the explanations thereof are omitted or simplified.

In addition, the process in which output light is obtained from the laser light source device 51 is also the same as the above-described embodiments, and the explanations thereof are omitted or simplified.

The laser light source device 51, as shown in FIGS. 12A and 12B, includes first and second prisms 515 and 516 which are translucent members, and a selective reflection film 517 provided therebetween.

The first prism 515 and the second prism 516 are formed in an isosceles triangular pillar-shaped form similar to each other, the low-angle is set to 45°.

The first prism 515, the second prism 516, and the selective reflection film 517 are formed in one body by connecting.

The support member 518 is provided on a surface 515A of the first prism 515.

The support member 518 adjusts the optical-path conversion element 514 so that the first laser light LS1 is output from a predetermined height (position) of the wavelength conversion element 312.

Specifically, the support member 518 positions the position of the optical-path conversion element 314 upper than the wavelength conversion element 312.

That is, the support member 51 lifts up a surface 515C (reflection surface) of the first prism 515 which reflects the light from the light source 311, and can thereby lead the first laser light LS1 to be output from the predetermined height H.

Here, the position of surface 515C which reflect the light of the light source 311 is P1.

Furthermore, the light, which has been converted into light of the second wavelength by the wavelength conversion element 312 in the process of traveling to the light source 311 due to the reflection from the external resonator 313, is reflected by the selective reflection film 517.

Furthermore, the light of second wavelength which is the second laser light LS2 is emitted due to reflection by a surface 516C of the second prism 516.

Here, the position of the surface 516C which reflects the light of the second wavelength is P2.

Distances from a connection face P0 in the first prism 515 and the second prism 516 to the above-described P1 and P2 are set to substantially equal.

That is, the W2 (the optical-axes between the first laser light LS1 and the second laser light LS2) can be expressed as (distance between P2 and P0) $\sqrt{2}$.

Therefore, the W2 can be set to a desired value by optionally modifying the form of the above-described support member 518, and it is possible to obtain the configuration in which the relationship W2<W1 is satisfied.

Figure 13:
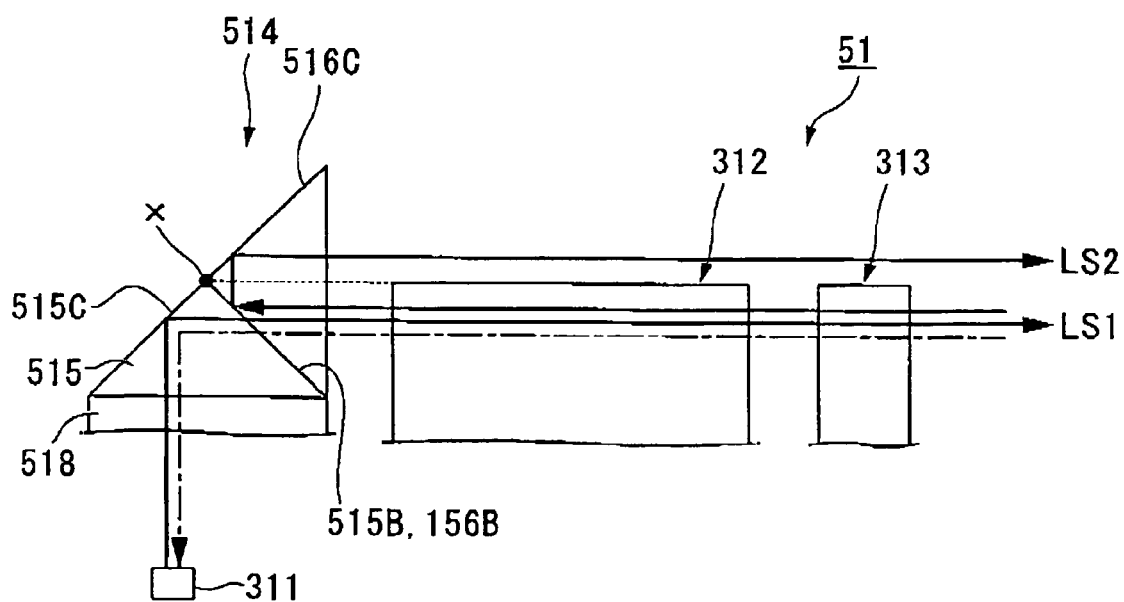
FIG. 13 is a cross-sectional view illustrating the positional relationship between a reflection surface of a prism and a wavelength conversion element.

Furthermore, in this embodiment, as shown in FIG. 13, the above-described support member 518 supports the optical-path conversion element 514 so that a point of intersection X by extending the reflection surface (surfaces 516B and 516C) of the second prism 516 substantially accords with the height of top surface of the wavelength conversion element 312.

It is thereby possible to emit the first laser light LS1 and the second laser light LS2 toward the exterior where the laser lights are close to each other.

Fourth Embodiment

Figure 14:
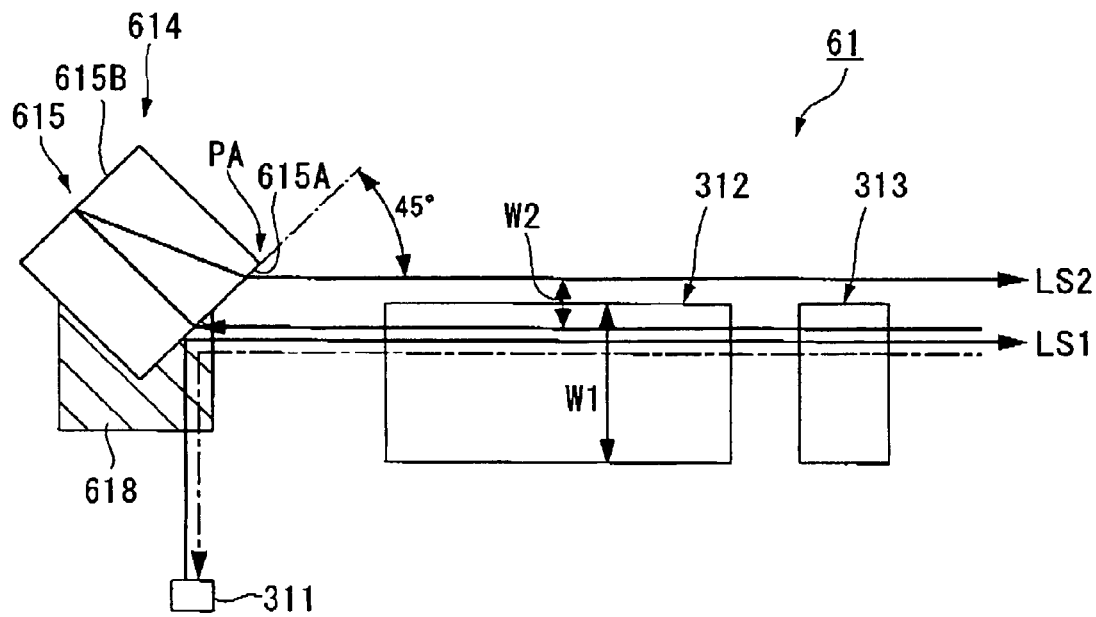
FIG. 14 is a schematic view showing a constitution of a laser light source device of a fourth embodiment.

FIG. 14 is a schematic view showing a constitution of a laser light source device 61 of a fourth embodiment.

The laser light source device 61 of the fourth embodiment includes a support member 618 which supports an optical-path conversion element 614, and which is an optical-path adjustment section.

Furthermore, in this embodiment, the optical-path conversion element 614 is constituted by a quadrangle pillar-shaped prism 615.

The other elements are similar to the above-described third embodiment.

Therefore, in FIG. 14, identical symbols are used for the elements which are identical to those of the above-described third embodiment, and the explanations thereof are omitted or simplified.

In addition, the process in which output light is obtained from the laser tight source device 61 is also the same as the third embodiments, and the explanations thereof can be omitted or simplified.

The quadrangle pillar-shaped prism 615 includes an optical-path separation surface 615A that reflects the light from the light source 311 and that leads the tight which has been converted into the second wavelength when the light is reflected by the external resonator 313 and passes through the wavelength conversion element 312 to be transmitted.

The light of the second wavelength which is captured via the optical-path separation surface 615A into the inner is reflected by a reflection surface 615B which is disposed so as to face to the optical-path separation surface 615A. After this reflection, the light which is the second laser light LS2 is emitted from the above-described optical-path separation surface 615A toward the exterior.

The above-described support member 618 makes the angle between the above-described optical-path separation surface 615A and the top surface of the wavelength conversion element 312 to be set at substantially 45°.

An end face PA of the optical-path separation surface 615A is disposed to be distant from the light source 311 further than the top surface of the wavelength conversion element 312.

Therefore, by including the above-described support member 618, the device configuration in which the relationship W2<W1 is satisfied can be obtained, and similar to the above-described embodiments, the laser light source device 61 can be provided in which the first laser light LS1 and the second laser light LS2 are extracted toward the exterior where the laser lights are close to each other.

In addition, since the quadrangle pillar-shaped prism is used as the optical-path conversion element 614, it is possible to lessen the boundary faces compared with when a plurality of prisms is combined (as in the first and second embodiment), and it is possible to decrease the light loss.

Fifth Embodiment

Figure 15:
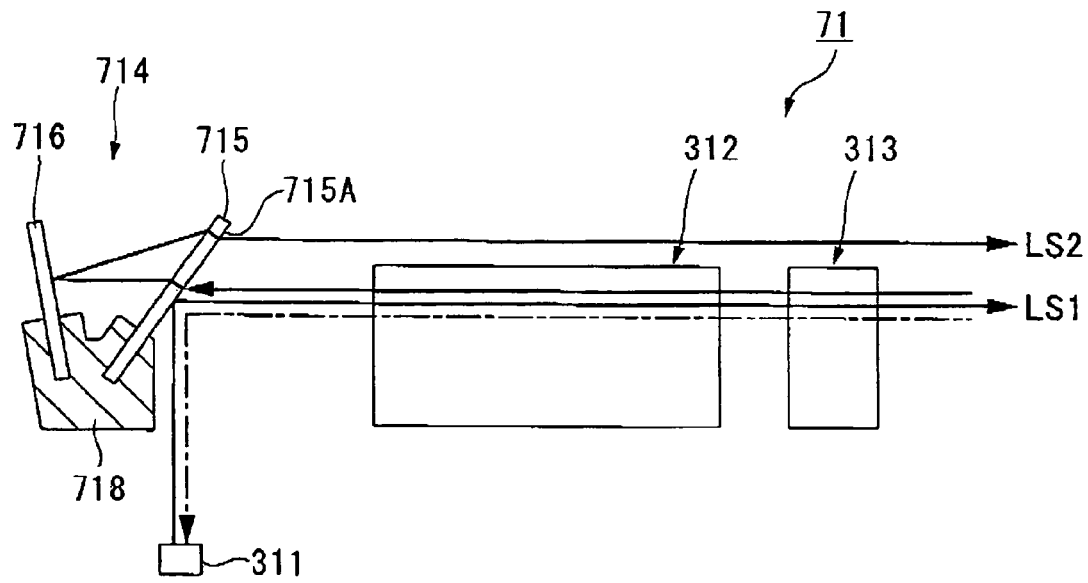
FIG. 15 is a schematic view showing a constitution of a laser light source device of a fifth embodiment.

FIG. 15 is a schematic view showing a constitution of a laser light source device 71 of a fifth embodiment.

The laser light source device 71 of the fifth embodiment includes a support member 718 which supports an optical-path conversion element 714, and which is an optical-path adjustment section.

In addition, in this embodiment, the optical-path conversion element 714 is constituted by first and second mirrors 715 and 716. The other elements are similar to the above-described fourth embodiment.

Therefore, in FIG. 15, identical symbols are used for the elements which are identical to those of the above-described fourth embodiment, and the explanations thereof are omitted or simplified.

In addition, the process in which output light is obtained from the laser light source device 71 is also the same as the above-described fourth embodiment, and the explanations thereof can be omitted or simplified.

The first mirror 715 includes an optical-path separation surface 715A that reflects the light of the light source 311 and that leads the light which has been converted into the second wavelength when the light is reflected by the external resonator 313 and passes through the wavelength conversion element 312 to be transmitted.

The optical-path separation surface 715A is constituted by the above-described selective reflection film 317.

Furthermore, the second mirror 716 reflects the light of the second wavelength that has been passed through the optical-path separation surface 715A.

The light of the second wavelength that has been reflected by the second mirror 716 passes through the first mirror 715, and emitted toward the exterior, as the second laser light LS2.

Here, the above-described support member 718 can adjust the optical-path of the light source 311 so that the first mirror 715 is set at a predetermined angle to the second mirror 716, and the first laser light LS1 is output from the predetermined position of the wavelength conversion element 312.

Therefore, the device configuration in which the relationship W2<W1 is satisfied can be obtained, and similar to the above-described embodiments, the laser light source device 71 can be provided in which the first laser light LS1 and the second laser tight LS2 can be extracted toward the exterior in the state that the laser lights are close to each other.

In addition, in this embodiment, since the mirror is used as the constitution reflecting the light from the light source 311, the device configuration is simplified, and it is possible to realize the reduction of the cost in the laser light source device 71.

Modified Example

A modified example regarding the laser light source device is explained below.

Figure 16:
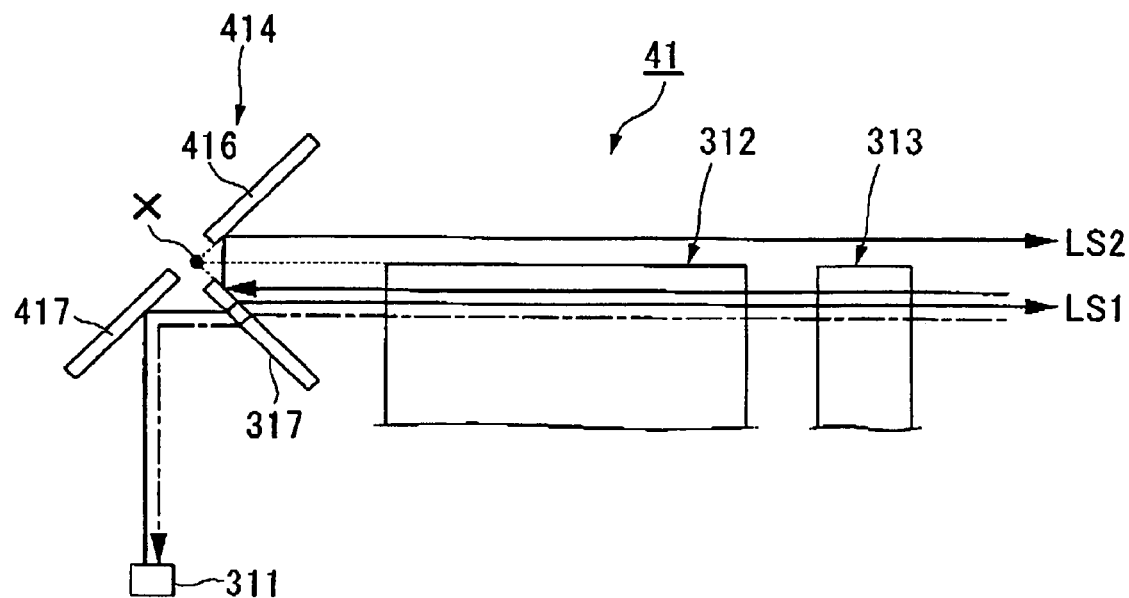
FIG. 16 is a schematic view showing a constitution of a laser light source device of a modified example.

FIG. 16 is a schematic view showing a constitution of a laser light source device 41 of a modified example of the above-described second embodiment.

As shown in FIG. 16, in this modified example, after the light of the light source 311 is reflected by a reflection mirror 417, the light is led to be incident into the selective reflection film 317.

That is, the point including the reflection mirror 417 is different from the constitution of the above-described second embodiment.

Since the reflection mirror 417 is provided, the degree of freedom in position at which the light source 311 is disposed can increase.

Furthermore, in the laser light source device 41 of the above-described second embodiment and this embodiment a point of intersection X made by extending the reflection surface of the reflection mirror 416 and the reflection surface of the selective reflection film 317 can substantially accord with the height of top surface of the wavelength conversion element 312.

Therefore, the configuration in which the first laser light LS1 and the second laser light LS2 are close to each other, that is, the device configuration in which the relationship W2<W1 is satisfied, can be acceptably obtained.

Figure 17:
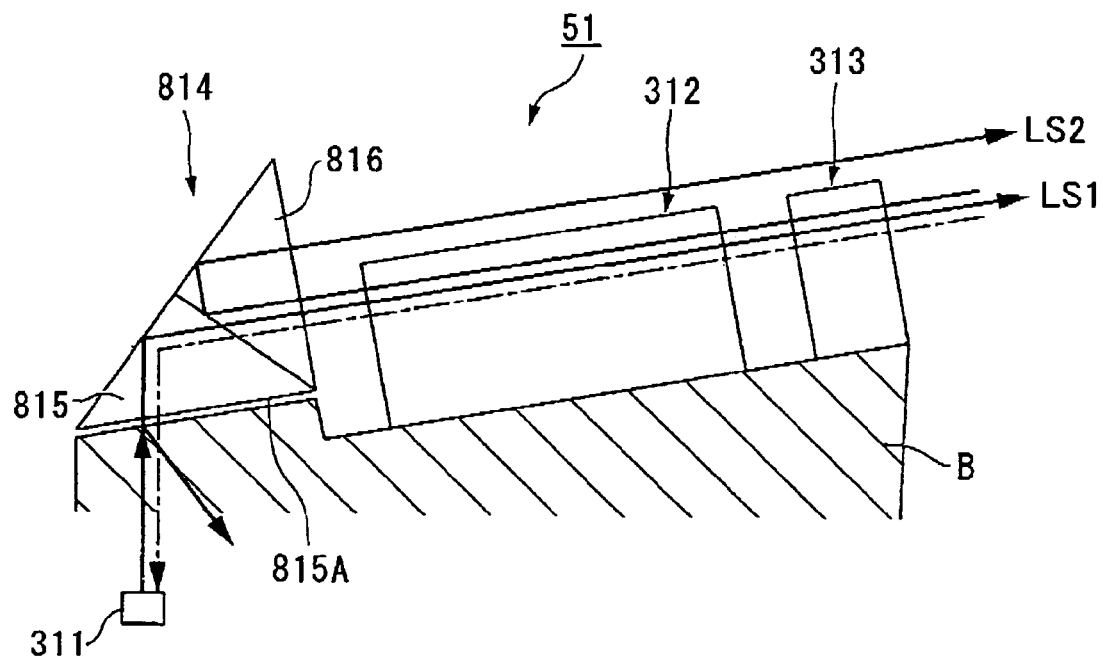
FIG. 17 is a schematic view showing a constitution of a laser light source device of a modified example.

FIG. 17 is a schematic view showing a constitution of a laser light source device 51 of a modified example of the above-described third embodiment.

As shown in FIG. 17, in this modified example, the base section B holding the light source 311, the wavelength conversion element 312, and the external resonator 313 are sloped configuration.

In FIG. 17, an illustration of the support member supporting the optical-path conversion element 814 is omitted.

The base member B includes the sloped configuration, and it is thereby possible to obtain the laser light source device emitting the first and second laser light LS1 and LS2 at the predetermined angle of elevation.

Furthermore, since the base member B includes the sloped configuration, a reflection light beam at an incidence face 815A of the first prism 815 is not returned to the light source 311.

Therefore, the resonance caused by an unwanted light beam becoming a noise component can be suppressed, and it is possible to obtain efficient emission.

What is claimed is:

1. A laser light source device comprising:
a light source emitting light of a first wavelength;
an external resonator selectively reflecting the light of the first wavelength and thereby leading the light toward the light source, and emitting a first laser light of a second wavelength which is different from the first wavelength;
a wavelength conversion element provided in a first optical-path formed between the light source and the external resonator, and converting the wavelength of part of incident light having the first wavelength into the second wavelength which is different from the first wavelength; and
an optical-path conversion element causing the light that has been converted into light of the second wavelength in the process of traveling to the light source due to reflection from the external resonator to be separated into a second optical-path different from the first optical-path, and emitting a second laser light of the second wavelength, wherein
the first laser light and the second laser light are utilized as output lights, and the height of the wavelength conversion element is greater than a distance between an optical-axis of the first laser light on an end face of the wavelength conversion element which is close to the external resonator and an optical-axis of the second laser light.

2. The laser light source device according to claim 1, wherein
the height of the external resonator is greater than the distance between the optical-axis of the first laser light and the optical-axis of the second laser light.

3. The laser light source device according to claim 1, wherein
the first laser light is substantially parallel to the second laser light.

4. The laser light source device according to claim 1, wherein
the length of the optical-path conversion element in the direction of the beam of the second laser light emitted from the optical-path conversion element is shorter than the height of the optical-path conversion element.

5. A laser light source device comprising:
a light source emitting light of a first wavelength;
an external resonator selectively reflecting the light of the first wavelength and thereby leading the light toward the light source, and emitting a first laser light of a second wavelength which is different from the first wavelength;

a wavelength conversion element provided in a first optical-path formed between the light source and the external resonator, converting the wavelength of part of incident light having the first wavelength into the second wavelength which is different from the first wavelength, and thereby obtaining harmonics;

an optical-path conversion element causing the light that has been converted into light of the second wavelength in the process of traveling to the light source due to reflection from the external resonator to be separated into a second optical-path different from the first optical-path, and emitting a second laser light of the second wavelength; and an optical-path adjustment section adjusting the first laser light to be output from a predetermined position in the wavelength conversion element, wherein the first laser light and the second laser light are utilized as output lights.

6. The laser light source device according to claim 5, wherein the optical-path conversion element includes:

a fundamental-wave conversion section converting the optical-path of the light of the first wavelength from the light source;

a separation section selectively reflecting the light that has been converted into the second wavelength in the process of traveling to the light source due to reflection from the external resonator and thereby separating the light into the second optical-path; and a harmonics optical-path conversion section converting the optical-path of light of the second wavelength that has been separated by the separation section and thereby making the light become the second laser light.

7. The laser light source device according to claim 5, wherein the optical-path conversion element includes the optical-path adjustment section.

8. The laser light source device according to claim 5, wherein the optical-path adjustment section is constituted by a support member supporting the optical-path conversion element.

9. The laser light source device according to claim 1, wherein the wavelength conversion element includes a holding face onto which a face of the wavelength conversion element is held, and a center section parallel to the optical-path of the first laser light in the wavelength conversion element, wherein the optical-path of the first laser light is positioned inside the wavelength conversion element and between the center section and the optical-path of the second laser light.

10. The laser light source device according to claim 1, wherein the light source includes a plurality of arrayed emission sections.

11. The laser light source device according to claim 1, wherein the wavelength conversion element is a wavelength conversion element of Quasi Phase Matching.

12. An illumination device comprising:

the laser light source device according to claim 1; and a diffusion optical member arranged in the direction of travel of the laser light emitted from the laser light source device.

13. The illumination device according to claim 12, wherein the diffusion optical member is formed by a computer generated hologram.

14. An image display device comprising:

a light source section constituted by the illumination device according to claim 12; and a light modulation element modulating the light emitted from the light source in accordance with image information.

15. A monitor device comprising:

the laser light source device according to claim 1;

a capturing section capturing an object which is irradiated by the laser light source device.

16. The laser light source device according to claim 5, wherein the wavelength conversion element includes a holding face onto which a face of the wavelength conversion element is held, and a center section parallel to the optical-path of the first laser light in the wavelength conversion element, wherein the optical-path of the first laser light is positioned inside the wavelength conversion element and between the center section and the optical-path of the second laser light.

17. The laser tight source device according to claim 5, wherein the light source includes a plurality of arrayed emission sections.

18. The laser light source device according to claim 5, wherein the wavelength conversion element is a wavelength conversion element of Quasi Phase Matching.

19. An illumination device comprising:

the laser light source device according to claim 5; and a diffusion optical member arranged in the direction of travel of the laser light emitted from the laser light source device.

20. An image display device comprising:

a light source section constituted by the illumination device according to claim 19; and a light modulation element modulating the light emitted from the light source in accordance with image information.

* * * * *